United States Patent
Murakami et al.

(10) Patent No.: US 11,336,842 B2
(45) Date of Patent: May 17, 2022

(54) IMAGING DEVICE

(71) Applicant: Panasonic Intellectual Property Management Co., Ltd., Osaka (JP)

(72) Inventors: Masashi Murakami, Kyoto (JP); Yasunori Inoue, Osaka (JP); Yoshihiro Sato, Osaka (JP); Kazuko Nishimura, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/185,845

(22) Filed: Feb. 25, 2021

(65) Prior Publication Data

US 2021/0185249 A1 Jun. 17, 2021

Related U.S. Application Data

(63) Continuation of application No. PCT/JP2019/040825, filed on Oct. 17, 2019.

(30) Foreign Application Priority Data

Jan. 8, 2019 (JP) .............................. JP2019-001199

(51) Int. Cl.
*H04N 5/343* (2011.01)
*H04N 5/374* (2011.01)
*H01L 27/146* (2006.01)

(52) U.S. Cl.
CPC .......... *H04N 5/343* (2013.01); *H01L 27/1461* (2013.01); *H01L 27/14612* (2013.01); *H04N 5/374* (2013.01)

(58) Field of Classification Search
CPC ...... H04N 5/343; H04N 5/374; H04N 5/3745; H04N 5/37452; H04N 5/341; H04N 5/335;

(Continued)

(56) References Cited

U.S. PATENT DOCUMENTS 7,075,049 B2 7/2006 Rhodes et al.
2008/0036888 A1* 2/2008 Sugawa ............. H04N 5/37457
348/294

(Continued)

FOREIGN PATENT DOCUMENTS

EP 3358625 A1 8/2018
JP 2006-148284 6/2006

(Continued)

OTHER PUBLICATIONS

International Search Report of PCT application No. PCT/JP2019/040825 dated Dec. 24, 2019.

(Continued)

*Primary Examiner* — John R Lee

(74) *Attorney, Agent, or Firm* — McDermott Will & Emery LLP

(57) ABSTRACT

An imaging device includes a first pixel. The first pixel has a photoelectric converting portion, a first capacitance element, and a first transistor. The photoelectric converting portion converts incident light into signal charge. The first capacitance element includes a first terminal and a second terminal, the first terminal being electrically connected to the photoelectric converting portion in at least a period of exposure. The first transistor includes a first source and a first drain, one of the first source and the first drain is electrically connected to the second terminal, and a direct-current potential is applied to the other of the first source and the first drain.

21 Claims, 22 Drawing Sheets

(58) Field of Classification Search
CPC ............... H01L 27/146; H01L 27/1461; H01L 27/14612
See application file for complete search history.

(56) References Cited

U.S. PATENT DOCUMENTS

| | | | |
|---|---|---|---|
| 2016/0190188 A1* | 6/2016 | Murakami | H01L 27/14609 250/214 A |
| 2016/0293654 A1* | 10/2016 | To | H01L 27/14609 |
| 2017/0004767 A1* | 1/2017 | Fujita | G09G 3/3283 |
| 2018/0241955 A1* | 8/2018 | Sakano | H04N 5/35563 |
| 2018/0308883 A1* | 10/2018 | Yanagita | H04N 5/35563 |
| 2018/0315786 A1* | 11/2018 | Hirase | G02B 7/04 |
| 2018/0331140 A1* | 11/2018 | Sato | H04N 5/3745 |
| 2018/0350859 A1* | 12/2018 | Yamashita | H04N 5/378 |
| 2019/0222782 A1* | 7/2019 | Kobayashi | G01T 1/24 |
| 2019/0238768 A1* | 8/2019 | Yamada | H04N 5/37452 |
| 2019/0289237 A1* | 9/2019 | Verbugt | H04N 5/3559 |
| 2020/0154066 A1* | 5/2020 | Johnson | H04N 5/3559 |
| 2020/0260026 A1* | 8/2020 | Ono | H01L 27/14621 |
| 2021/0185249 A1* | 6/2021 | Murakami | H04N 5/363 |

FOREIGN PATENT DOCUMENTS

| | | |
|---|---|---|
| JP | 2006-217410 | 8/2006 |
| JP | 2012-147169 | 8/2012 |

OTHER PUBLICATIONS

The Extended European Search Report dated Feb. 25, 2022 for the related European Patent Application No. 19909132.3.

* cited by examiner

IMAGING DEVICE

BACKGROUND

1. Technical Field

The present disclosure relates to an imaging device.

2. Description of the Related Art

In recent years, imaging devices have been widely used in various fields of products, such as video cameras, digital still cameras, surveillance cameras, and vehicle-mounted cameras. Charge-coupled device (CCD) solid-state imaging devices and complementary metal-oxide semiconductor (CMOS) solid-state imaging devices can be exemplified as the imaging devices.

Japanese Unexamined Patent Application Publication No. 2006-217410, Japanese Unexamined Patent Application Publication No. 2012-147169, and Japanese Unexamined Patent Application Publication No. 2006-148284 disclose examples of the imaging devices.

SUMMARY

One non-limiting and exemplary embodiment provides a technology that is suitable for changing the sensitivity of an imaging device.

The present disclosure provides an imaging device including a first pixel. The first pixel includes: a photoelectric converting portion that converts incident light into signal charge; a first capacitance element including a first terminal and a second terminal, the first terminal being electrically connected to the photoelectric converting portion in at least a period of exposure; and a first transistor including a first source and a first drain, one of the first source and the first drain being electrically connected to the second terminal, and a direct-current potential being applied to the other of the first source and the first drain.

The present disclosure provides a technology that is suitable for changing the sensitivity of an imaging device.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION (Knowledge Underlying Present Disclosure)

Figure 1:
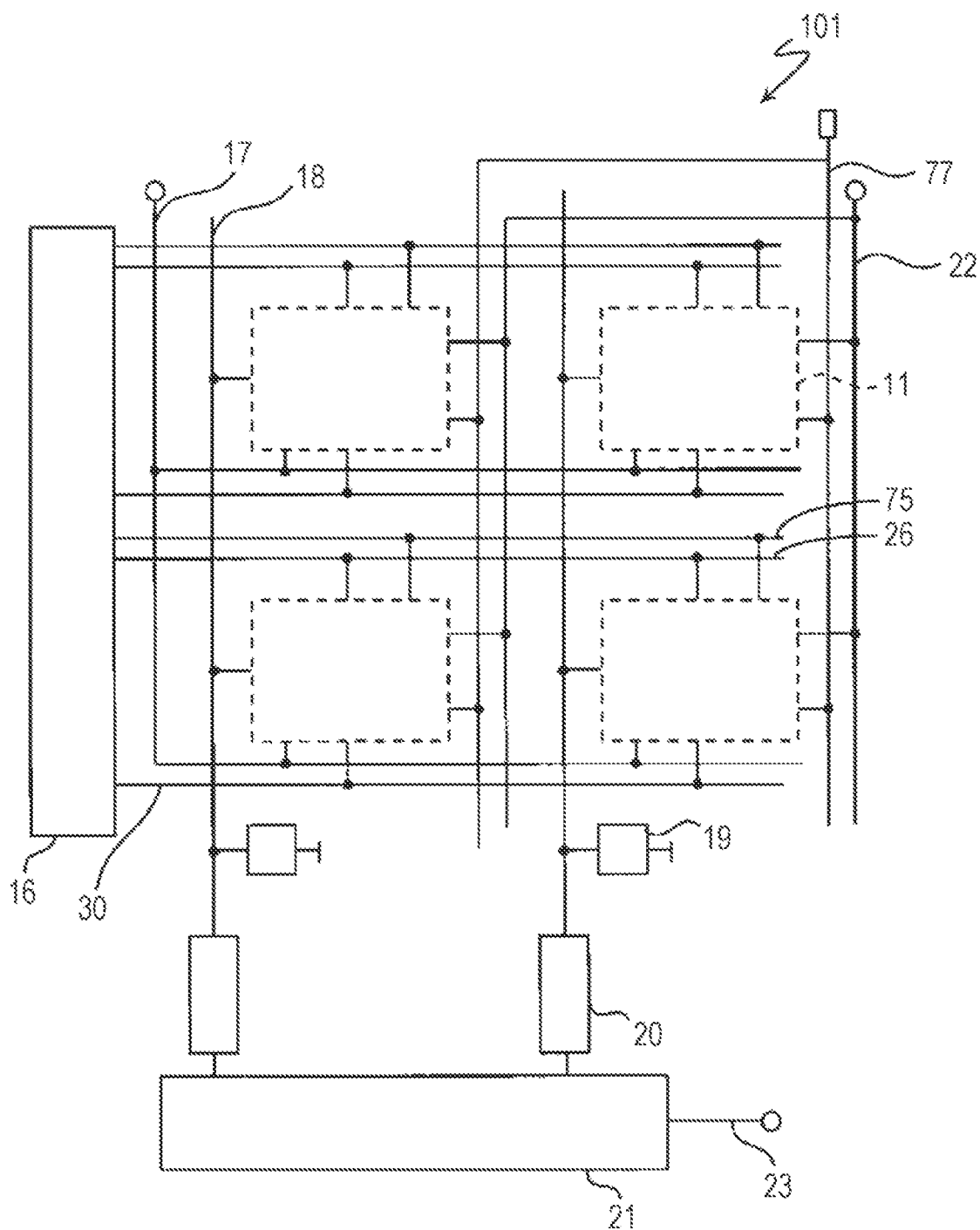
FIG. 1 is a schematic diagram showing an exemplary circuit configuration of an imaging device according to a first embodiment.

A technology that is suitable for changing the sensitivity of an imaging device can enhance merchantability of the imaging device. Such a technology can, for example, realize a wide dynamic range.

Brief Summary of One Aspect According to Present Disclosure

An imaging device according to a first aspect of the present disclosure is an imaging device including a first pixel that includes:

a photoelectric converting portion that converts incident light into signal charge;

a first capacitance element including a first terminal and a second terminal, the first terminal being electrically connected to the photoelectric converting portion in at least a period of exposure; and a first transistor including a first source and a first drain, one of the first source and the first drain being electrically connected to the second terminal, and a direct-current potential being applied to the other of the first source and the first drain.

The first aspect is suitable for changing the sensitivity of the imaging device. In the first aspect, the first terminal of the first capacitance element is electrically connected to the photoelectric converting portion in at least a period of exposure. For example, the first terminal of the first capacitance element may be electrically connected to the photoelectric converting portion directly or through a wire without presence of a switch, such as a transistor, between the first terminal of the first capacitance element and the photoelectric converting portion. Thus, the first terminal of the first capacitance element is always connected to the photoelectric converting portion. The same also applies to a 19th aspect described below.

In a second aspect of the present disclosure, for example, in the imaging device according to the first aspect, the other of the first source and the first drain may be connected to a fixed potential.

When a fixed potential is connected to the other of the first source and the first drain, as in the second aspect, it is possible to easily realize a configuration in which a direct-current potential is applied to the other.

In a third aspect of the present disclosure, for example, in the imaging device according to the second aspect, the fixed potential may be a ground potential.

The ground potential in the third aspect is a specific example of the fixed potential.

In a fourth aspect of the present disclosure, for example, the imaging device according to one of the first to third aspects may further include a control circuit that turns on or off the first transistor in accordance with a photography mode.

According to the fourth aspect, turning on or off of the first transistor can be controlled in accordance with the photography mode.

In a fifth aspect of the present disclosure, for example, in the imaging device according to the fourth aspect,
the photography mode may include a first mode and a second mode;
a sensitivity in the second mode may be lower than a sensitivity in the first mode;
in the first mode, the signal charge may be read out in a state in which the first transistor is off; and
in the second mode, the signal charge may be read out in a state in which the first transistor is on.

According to the fifth aspect, it is possible to realize the first mode in which the sensitivity is high and the second mode in which the sensitivity is low.

In a sixth aspect of the present disclosure, for example, in the imaging device according to one of the first to fifth aspects,
the first pixel may have a second transistor including a second source, a second drain, and a second gate;
the first terminal may be the second gate; and
the second terminal may be one of the second source and the second drain.

According to the sixth aspect, the first capacitance element can be realized utilizing a transistor.

In a seventh aspect of the present disclosure, for example, the imaging device according to one of the first to fifth aspects may further include:
an insulating layer that is a layer of an oxide insulator;
a first wire provided in the insulating layer; and
a second wire provided in the insulating layer,
wherein the first capacitance element may include a dielectric layer,
the first terminal may include at least a portion of the first wire,
the second terminal may include at least a portion of the second wire, and
the dielectric layer may include a portion of the insulating layer in which the first wire and the second wire are embedded.

According to the seventh aspect, it is possible to realize a first capacitance element having a metal-oxide-metal (MOM) structure.

In an eighth aspect of the present disclosure, for example, the imaging device according to one of the first to fifth aspects may include
an insulating layer, and
the first capacitance element may be provided in the insulating layer,
the first capacitance element may include a dielectric layer,
the first terminal may be a first electrode,
the second terminal may be a second electrode, and
the dielectric layer and the insulating layer may differ from each other in composition.

According to the eighth aspect, it is possible to realize a first capacitance element having a metal-insulator-metal (MIM) structure.

In a ninth aspect of the present disclosure, for example, the imaging device according to one of the first to eighth aspects may further include:
a voltage fluctuation wire in which a voltage fluctuates; and
a first shield;
the voltage fluctuation wire and the first shield may be located in the first pixel; and
a distance between the voltage fluctuation wire and the first shield may be smaller than a distance between the voltage fluctuation wire and the first capacitance element.

The first shield in the ninth aspect is suitable for suppressing coupling between the voltage fluctuation wire and first capacitance element. Even when the voltage of the voltage fluctuation wire fluctuates, the suppression of the coupling makes it difficult for the fluctuation to affect a region in which the charge generated by the photoelectric converting portion is present. This is advantageous from the perspective of suppressing noise mixing into a signal corresponding to the signal charge.

In a tenth aspect of the present disclosure, for example, in the imaging device according to the ninth aspect, the voltage of the voltage fluctuation wire may be changed in a state in which a voltage of the first shield is fixed.

The tenth aspect is advantageous from the perspective of suppressing mixing of the above-described noise.

In an 11th aspect of the present disclosure, for example, the imaging device according to the ninth aspect or the tenth aspect may further include a semiconductor substrate, and in a first section that is orthogonal to a thickness direction of the semiconductor substrate, the first shield may be provided between the voltage fluctuation wire and the first capacitance element.

The 11th aspect is advantageous from the perspective of suppressing mixing of the above-described noise.

In a 12th aspect of the present disclosure, for example, the imaging device according to one of the ninth to 11th aspects may further include a semiconductor substrate, and in a second section that is parallel to a thickness direction of the semiconductor substrate, the first shield may be provided between the voltage fluctuation wire and the first capacitance element.

The 12th aspect is advantageous from the perspective of suppressing mixing of the above-described noise.

In a 13th aspect of the present disclosure, for example, in the imaging device according to one of the ninth to 12th aspects, a line segment that connects the voltage fluctuation wire and the first capacitance element may pass through the first shield.

The 13th aspect is advantageous from the perspective of suppressing mixing of the above-described noise.

In a 14th aspect of the present disclosure, for example, in the imaging device according to one of the first to 13th aspects, the first pixel may have a first diffusion region electrically connected to the photoelectric converting portion and the first terminal.

Signal charge generated in the photoelectric converting portion can be accumulated in the first diffusion region in the 14th aspect.

In a 15th aspect of the present disclosure, for example, in the imaging device according to the 14th aspect, the first pixel may have a third transistor including a third source and a third drain, and a fourth transistor including a fourth gate;

the first diffusion region may be one of third source and the third drain; and the first diffusion region may be electrically connected to the fourth gate.

In the 15th aspect, the first diffusion region can be realized utilizing the third transistor. The fourth transistor can be utilized to amplify the signal charge generated in the photoelectric converting portion and to generate a signal corresponding to the signal charge.

In a 16th aspect of the present disclosure, for example, in the imaging device according to the 14th aspect or the 15th aspect, the photoelectric converting portion may include a pixel electrode, a counter electrode, and a photoelectric conversion layer arranged between the pixel electrode and the counter electrode; and the pixel electrode may be electrically connected to the first diffusion region and the first terminal.

The photoelectric converting portion in the 16th aspect is one specific example of the photoelectric converting portion.

In a 17th aspect of the present disclosure, for example, in the imaging device according to the 14th aspect, the photoelectric converting portion may be a photodiode; and the photodiode may include the first diffusion region.

The photoelectric converting portion in the 17th aspect is one specific example of the photoelectric converting portion.

In an 18th aspect of the present disclosure, for example, in the imaging device according to the 14th aspect or the 15th aspect, the first pixel may have a fifth transistor;

the photoelectric converting portion may be a photodiode; and the signal charge may be transferred from the photodiode to the first diffusion region via the fifth transistor.

The photoelectric converting portion in the 18th aspect is one specific example of the photoelectric converting portion.

A camera system according to the 19th aspect of the present disclosure incudes:

an imaging device that includes a first pixel including a photoelectric converting portion that converts incident light into signal charge, a first capacitance element including a first terminal and a second terminal, the first terminal being electrically connected to the photoelectric converting portion in at least a period of exposure, and a first transistor including a first source and a first drain, one of the first source and the first drain being electrically connected to the second terminal, and a direct-current potential being applied to the other of the first source and the first drain; and a control circuit that turns on or off the first transistor in accordance with a photography mode.

The 19th aspect is suitable for changing the sensitivity of the imaging device in accordance with the photography mode.

In the embodiments described below, the distance between two objects represents the length of a shortest line segment that connects the two objects.

In the embodiment described below, a via-hole and a conductor therein are collectively referred to as a "via".

In the embodiments described below, the term "node" may be used. The node means an electrical connection portion between elements in an electrical circuit and is a concept including a wire and so on that have a role in providing electrical connection between the elements.

In the embodiments described below, ordinals "first, second, third, . . . " may be used. When one element is denoted by an ordinal, it is not essential that the same type of element with a smaller ordinal exists. The numbers of ordinals can also be changed, as appropriate. The same or similar configurations are denoted by the same reference numerals, and a redundant description thereof may be omitted.

First Embodiment

FIG. 1 schematically illustrates an exemplary circuit configuration of an imaging device according to a first embodiment. An imaging device 101 illustrated in FIG. 1 includes a plurality of pixels 11 and peripheral circuitry. The plurality of pixels 11 is two-dimensionally arrayed on a semiconductor substrate to thereby form a photosensitive region. The photosensitive region may also be referred to as a "pixel region". The semiconductor substrate is not limited to a substrate that is entirely made of semiconductor. The semiconductor substrate may include an insulating substrate and a semiconductor layer provided on the insulating substrate. A photosensitive region is formed at a surface of the semiconductor layer.

In the illustrated example, the plurality of pixels 11 is arrayed in a row direction and a column direction. Herein, the row direction and the column direction refer to directions in which a row and a column extend, respectively. In the planes of the drawings, the vertical direction is the column direction, and the horizontal direction is the row direction. The plurality of pixels 11 may be arrayed one dimensionally. In other words, the imaging device 101 can be a line sensor.

Each of the pixels 11 is connected to a power-supply wire 22. A predetermined power-supply voltage is supplied to each pixel 11 through the power-supply wire 22. As described below in detail, each of the pixels 11 in the present embodiment includes a photoelectric converting portion having a photoelectric conversion layer laminated on a semiconductor substrate. Also, as illustrated in FIG. 1, the imaging device 101 has an accumulation control line 17 for applying the same constant voltage to all the photoelectric converting portions.

Each of the pixels 11 is also connected to a reset voltage line 77. A reset voltage Vr is supplied to each pixel 11 through the reset voltage line 77.

The peripheral circuitry in the imaging device 101 includes a vertical scanning circuit 16, a load circuit 19, a column-signal processing circuit 20, and a horizontal-signal readout circuit 21. The vertical scanning circuit 16 may also be referred to as a "row scanning circuit 16". The column-signal processing circuit 20 may also be referred to as a "row signal accumulation circuit 20". The horizontal-signal readout circuit 21 may also be referred to as a "column scanning circuit 21", In the illustrated configuration, one column-signal processing circuit 20 and one load circuit 19 are arranged for each of the columns of the pixels 11 that are two-dimensionally arrayed. That is, in this example, the peripheral circuitry includes two or more column-signal processing circuits 20 and two or more load circuits 19.

The vertical scanning circuit 16 is connected to address signal lines 30 and reset signal lines 26. By applying a predetermined voltage to the address signal lines 30, the vertical scanning circuit 16 selects the pixels 11, arranged in the rows, row by row. Then, readout of signal voltages of the selected pixels 11 is executed.

The vertical scanning circuit 16 is also connected to switching control lines 75. By suppling a predetermined voltage to the plurality of pixels 11 through the switching control lines 75, as described below, the vertical scanning circuit 16 can change the sensitivity of the imaging device 101.

In the present disclosure, each of the pixels 11 has one or more capacitance elements therein, as will be described below in detail. Herein, the "capacitance element (capacitor)" means a structure in which one pair of terminals is provided with a dielectric being interposed therebetween. The dielectric is typically an insulator. The "terminals" as used herein are not limited to terminals formed of metal and are construed to widely include a polysilicon layer and so on. The "terminals" as used herein may each be a portion of a semiconductor substrate.

The pixels 11 arranged in each column are electrically connected to the column-signal processing circuit 20 through a vertical signal line 18 corresponding to the column. The load circuit 19 is electrically connected to the vertical signal line 18. The column-signal processing circuit 20 performs noise suppression signal processing, typified by correlated double sampling, analog-to-digital conversion (AD conversion), and so on. The horizontal-signal readout circuit 21 is electrically connected to the column-signal processing circuits 20 provided so as to correspond to the columns of the pixels 11. The horizontal-signal readout circuit 21 sequentially reads out signals from the column-signal processing circuits 20 to a horizontal common signal line 23.

Figure 2:
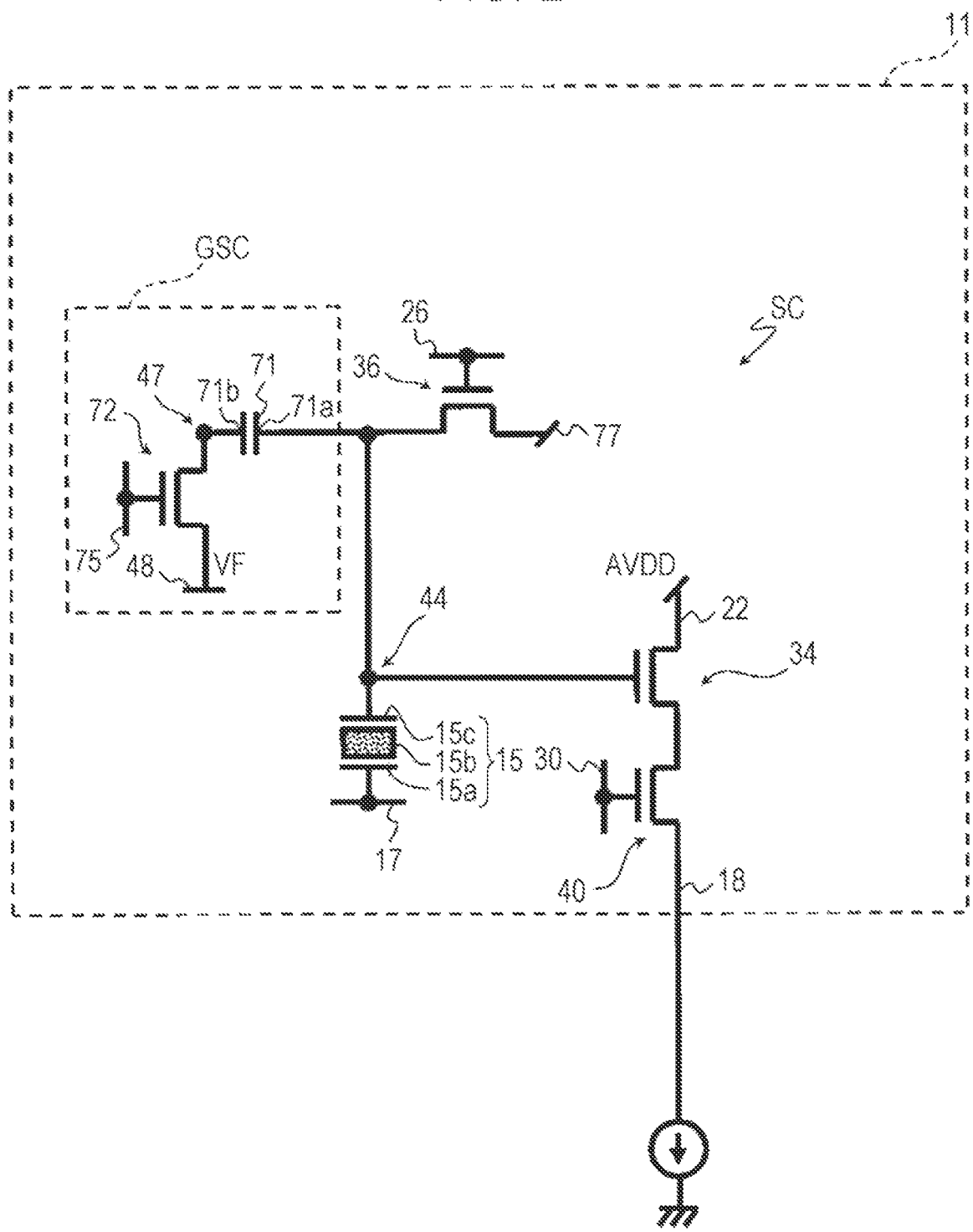
FIG. 2 is a schematic diagram illustrating an exemplary circuit configuration of a pixel illustrated in FIG. 1.

FIG. 2 illustrates an exemplary circuit configuration of the pixels 11 illustrated in FIG. 1. Each pixel 11 includes a photoelectric converting portion 15, a signal detection circuit SC, and a sensitivity switching circuit GSC.

The photoelectric converting portion 15 converts incident light into signal charge. In the present embodiment, the photoelectric converting portion 15 has a structure in which a photoelectric conversion layer 15b is sandwiched between a counter electrode 15a a pixel electrode 15c. As will be described below with reference to the drawings, the photoelectric conversion layer 15b is laminated on a semiconductor substrate at which the pixels 11 are formed. The photoelectric conversion layer 15b is formed of organic material or inorganic material, such as amorphous silicon. The photoelectric conversion layer 15b may include a layer composed of organic material and a layer composed of inorganic material. Typically, the photoelectric conversion layer 15b has a film shape.

The counter electrode 15a is provided adjacent to a light-receiving surface of the photoelectric conversion layer 15b. The counter electrode 15a is formed of transparent electrically conductive material, such as indium tin oxide (ITO). The pixel electrode 15c is provided at a side that faces the counter electrode 15a with the photoelectric conversion layer 15b being interposed therebetween. The pixel electrode 15c collects signal charge generated by photoelectric conversion in the photoelectric conversion layer 15b. The pixel electrode 15c is formed of metal, such as aluminum or copper, a metal nitride, polysilicon that is given an electrical conductivity property by doping an impurity, or the like.

As illustrated in FIG. 2, the counter electrode 15a is connected to the accumulation control line 17, and the pixel electrode 15c is connected to a charge accumulation node (also referred to as a "floating diffusion node") 44. Controlling the potential of the counter electrode 15a through the accumulation control line 17 allows the pixel electrode 15c to collect either holes or electrons of hole-electron pairs generated by photoelectric conversion. When the holes are used as the signal charge, it is sufficient that the potential of the counter electrode 15a be higher than that of the pixel electrode 15c. A case in which the holes are used as the signal charge will be described below by way of example. For example, a voltage of about 10 V is applied to the counter electrode 15a through the accumulation control line 17. As will be described below in detail, a charge accumulation node 44 and an electrical connection portion thereof form a charge accumulation portion. As a result of the voltage application to the counter electrode 15a, signal charge is accumulated in the charge accumulation portion. Naturally, the electrons may be used as the signal charge.

The signal detection circuit SC included in the pixel 11 includes an amplifying transistor 34 and a first reset transistor 36. In the configuration illustrated in FIG. 2, one of a source and a drain of the first reset transistor 36 is connected to the charge accumulation node 44. Specifically, in an example described below with reference to FIGS. 12 and 13, one of the source and the drain of the first reset transistor 36 constitutes a first diffusion region 44z, and the first diffusion region 44z is connected to the charge accumulation node 44. The other of the source and the drain of the first reset transistor 36 is connected to the reset voltage line 77.

Referring back to FIG. 2, a gate of the amplifying transistor 34 is connected to the charge accumulation node 44. The gate of the amplifying transistor 34 has electrical connection with the pixel electrode 15c. One of a source and a drain of the amplifying transistor 34 is connected to the power-supply wire 22, and the other of the source and the drain is connected to the vertical signal line 18 through an address transistor 40. One of the source and the drain of the amplifying transistor 34 can be a drain when the amplifying transistor 34 is an N-channel MOS. In the illustrated example, the power-supply wire 22 is a source follower power source. The amplifying transistor 34 and the load circuit 19 illustrated in FIG. 1 form a source follower circuit. The amplifying transistor 34 amplifies a signal generated by the photoelectric converting portion 15.

As illustrated in FIG. 2, the pixel 11 includes the address transistor 40. A source or a drain of the address transistor 40 is connected to one of the source and the drain of the amplifying transistor 34, the one being not connected to the power-supply wire 22. A gate of the address transistor 40 is connected to the address signal line 30. In the configuration illustrated in FIG. 2, the address transistor 40 constitutes a portion of the signal detection circuit SC.

A voltage corresponding to the amount of signal charge accumulated in the charge accumulation portion is applied to the gate of the amplifying transistor 34. The amplifying transistor 34 amplifies the voltage. The voltage amplified by the amplifying transistor 34 is selectively read out by the address transistor 40 as the signal voltage.

The sensitivity switching circuit GSC included in the pixel 11 includes a first capacitance element 71 and a sensitivity switching transistor 72. The first capacitance element 71 includes a first terminal 71a, a second terminal 71b, and a dielectric layer. The sensitivity switching transistor 72 includes a gate, a source, and a drain.

In the first capacitance element 71, the first terminal 71a and the second terminal 71b are provided with the dielectric layer being interposed therebetween. In the configuration illustrated in FIG. 2, the first terminal 71a is connected to the charge accumulation node 44. The first terminal 71a is electrically connected to the photoelectric converting portion 15. Specifically, the first terminal 71a is electrically connected to the pixel electrode 15c.

One of the source and the drain of the sensitivity switching transistor 72 is electrically connected to the second terminal 71b. A direct-current potential is applied to the other of the source and the drain of the sensitivity switching transistor 72.

The aforementioned direct-current potential may be a fixed potential or may be a ground potential. On the other hand, the direct-current potential may be different between in one period and in another period, rather than being a fixed potential. The expression "direct-current potential is applied to the other of the source and the drain of the sensitivity switching transistor 72" is a concept encompassing such a case.

In the present embodiment, the other of the source and the drain of the sensitivity switching transistor 72 is connected to a fixed potential VF. Specifically, the other of the source and the drain of the sensitivity switching transistor 72 is electrically connected to a fixed potential portion 48 having the fixed potential VF. The fixed potential portion 48 has a function for suppressing fluctuation of the potential of the charge accumulation node 44 via the first capacitance element 71.

The fixed potential VF is, for example, a ground potential. The ground potential in this case is a ground potential of the imaging device 101. With such an arrangement, the impedance of the fixed potential portion 48 can be reduced. This makes it possible to enhance the above-described function of the fixed potential portion 48.

In another example, the direct-current potential is a potential that is the same as the potential of the reset voltage line 77. With this arrangement, the potential of the first terminal 71a and the potential of the second terminal 71b of the first capacitance element 71 can be set to the same potential during resetting. This makes it difficult for a voltage exceeding an appropriate range to be applied between the first terminal 71a and the second terminal 71b. This is advantageous from the perspective of suppressing leakage current between the first terminal 71a and the second terminal 71b. Also, this is advantageous from the perspective of ensuring the reliability of the first capacitance element 71. The potential of the reset voltage line 77 is, for example, about 1 V. When the direct-current potential is the same as the potential of the reset voltage line 77, these potentials may be fixed potentials, or the magnitude of the potential in one period may be changed from the magnitude of the potential in another period.

One of the pixels 11 can be referred to as a "first pixel 11", for the sake of convenience. The first pixel 11 can be said to have the photoelectric converting portion 15, the first capacitance element 71, and the sensitivity switching transistor 72, which are described above.

Each of the amplifying transistor 34, the first reset transistor 36, the address transistor 40, and the sensitivity switching transistor 72 may be an N-channel MOS or a P-channel MOS. All of these transistors do not have to be unified to either N-channel MOSs or P-channel MOSs. A case in which the amplifying transistor 34, the first reset transistor 36, the address transistor 40, and the sensitivity switching transistor 72 are N-channel MOSs will be described below by way of example.

(Overview of Operation of Imaging Device 101)

According to the configuration illustrated in FIG. 2, appropriately controlling a gate voltage of the sensitivity switching transistor 72 makes it possible to change the sensitivity of the imaging device 101.

In the present embodiment, the imaging device 101 includes a control circuit that turns on or off the sensitivity switching transistor 72 in accordance with a photography mode. With this arrangement, the sensitivity can be changed for each row. In the present embodiment, the vertical scanning circuit 16 illustrated in FIG. 1 corresponds to the control circuit. However, the imaging device 101 may include, as the control circuit, an element that is different from the vertical scanning circuit 16. Also, the sensitivity switching transistors 72 in all the pixels 11 may be turned on or off at a time.

In the present embodiment, the photography mode includes a first mode and a second mode. The sensitivity in the second mode is lower than the sensitivity in the first mode. In the first mode, the signal charge is read out in a state in which the sensitivity switching transistor 72 is off. In the second mode, the signal charge is read out in a state in which the sensitivity switching transistor 72 is on.

As described above, the voltage corresponding to the amount of the signal charge accumulated in the charge accumulation portion is applied to the gate of the amplifying transistor 34. The amplifying transistor 34 amplifies the voltage. The address transistor 40 reads out the amplified voltage as a signal voltage. The above-described signal-charge readout corresponds to the signal-voltage readout performed by the address transistor 40.

In one specific example, in a period in which the photography mode is the first mode, when the signal voltage that is read out increases beyond a first threshold voltage, the control circuit switches the photography mode from the first mode to the second mode. In a period in which the photography mode is the second mode, when the signal voltage that is read out decreases below a second threshold voltage, the control circuit switches the photography mode from the second mode to the first mode. With such an arrangement, the photography mode can be set to the first mode when illuminance is low, and the photography mode can be set to the first mode when illuminance is high. The first threshold voltage and the second threshold voltage may be the same or may be different from each other.

In the present embodiment, the vertical scanning circuit 16, which is the control circuit, can supply a predetermined voltage to the gate of the sensitivity switching transistor 72 through the switching control line 75. In a period in which the predetermined voltage is supplied to the gate of the sensitivity switching transistor 72, the sensitivity switching transistor 72 is on. In a period in which the predetermined voltage is not supplied to the gate of the sensitivity switching transistor 72, the sensitivity switching transistor 72 is off.

[Sensitivity Change by Floating Control]

In a period in which the sensitivity switching transistor 72 is on, the fixed potential VF is supplied to the second terminal 71b via the sensitivity switching transistor 72. In this case, since the potential of the second terminal 71b is fixed, the first capacitance element 71 is seen as a capacitance. In contrast, in a period in which the sensitivity switching transistor 72 is off, the fixed potential VF is not supplied to the second terminal 71b. In this case, since the second terminal 71b is in a floating state, the first capacitance element 71 is not virtually seen as a capacitance. Making the first capacitance element 71 seen as a capacitance allows the sensitivity to be set relatively low. Conversely, making the first capacitance element 71 virtually unseen allows the sensitivity to be set to relatively high. That is, controlling whether or not the second terminal 71b is put into the floating state makes it possible to change the sensitivity. This control can be referred to as "floating control".

A state in which the first capacitance element 71 is seen as a capacitance and a state in which the first capacitance element 71 is not virtually seen as a capacitance will be described below in detail. A capacitance value of the first capacitance element 71 is defined as Cx. The amount of signal charge accumulated in the first capacitance element 71 is defined as Qx. A voltage across the first terminal 71a and the second terminal 71b of the first capacitance element 71 is defined as Vx. In this case, a relational expression Cx=Qx/Nx holds true. In the period in which the sensitivity switching transistor 72 is off, a direct-current potential is not applied to the second terminal 71b, the second terminal 71b is in the floating state, and charge is not virtually accumulated in the second terminal 71b. In this period, since Qx≈0 is given, Cx=Qx/Vx≈0 is given. This state is the state in which the first capacitance element 71 is not virtually seen as a capacitance. On the other hand, in the period in which the sensitivity switching transistor 72 is on, a direct-current potential is applied to the second terminal 71b. In this period, charge is accumulated in the second terminal 71b to a degree that the first capacitance element 71 exhibits a characteristic of a capacitance. This state is the state in which the first capacitance element 71 is seen as a capacitance.

In other words, states that can be assumed by the sensitivity switching transistor 72 and the first terminal 71a include a first state and a second state. In the first state, the sensitivity switching transistor 72 is in an off state, and the first terminal 71a is in a floating state. In the second state, the sensitivity switching transistor 72 is in an on state, and a direct-current potential is supplied to the second terminal 71b via the sensitivity switching transistor 72.

Assume that the sensitivity switching transistor 72 and the fixed potential portion 48 are omitted as in the imaging device of the related art, and two types of voltage can be selectively supplied to the second terminal 71b. In such a case, a width within which the sensitivity can be adjusted is limited. Specifically, in this case, selecting Vx from two types of voltage makes it possible to change Cx. However, even with such an arrangement, Cx cannot be set to zero. Also, the range of values that can be taken by Vx is limiting. Thus, as can be understood from the relational expression Cx=Qx/Vx, the range of values that can be taken by Cx is also limiting. This means that the width within which the sensitivity can be adjusted is limiting.

In contrast, according to the above-described floating control, the sensitivity can be broadly adjusted. Specifically, according to the above-described floating control, Qx≈0 can be accomplished, and thus Cx≈0 can be accomplished. This makes it possible to perform broad adjustment of the sensitivity. For the reason described above, the sensitivity switching circuit GSC illustrated in FIG. 2 is suitable for adjusting the sensitivity.

As can be understood from the above description, a node 47 between the first capacitance element 71 and the sensitivity switching transistor 72 can also enter a floating state and a non-floating state.

[Increase in Saturation]

A combination of the sensitivity switching transistor 72 and the first capacitance element 71 not only controls the sensitivity but can also increase the largest amount of signal charge (the amount of saturation charge) that can be accumulated in the charge accumulation portion (i.e., increase the saturation).

With respect to the capacitance value Cx of the first capacitance element 71, the amount Qx of signal charge accumulated in the first capacitance element 71, and the voltage Vx across the first terminal 71a and the second terminal 71b of the first capacitance element 71, the relational expression Cx=Qx/Vx holds true as described above. That is, the relational expression Qx=Cx×Vx holds true.

In the period in which the sensitivity switching transistor 72 is on, a direct-current potential is applied to the second terminal 71b. In this period, the first capacitance element 71 exhibits a characteristic of a capacitance.

In one example of the present embodiment, the photoelectric converting portion 15 is electrically connected to the first terminal 71a of the first capacitance element 71. Hence, part of the signal charge generated by the photoelectric converting portion 15 can be accumulated in the first capacitance element 71 as Qx. That is, when the photoelectric converting portion 15 is electrically connected to the first capacitance element 71, the largest amount of signal charge that can be accumulated in the charge accumulation portion can be increased by an amount corresponding to Qx=Cx×Vx, compared with a case in which the photoelectric converting portion 15 is not electrically connected to the first capacitance element 71.

According to the present embodiment, since the largest amount of signal charge (the amount of saturation charge) that can be accumulated under high illuminance can be increased, it is possible to address a phenomenon (highlight clipping) in which a bright portion of a subject, for example, a bright blue sky or the like, becomes white, which is an issue in the related art. Also, increasing the largest amount of signal charge is also advantageous in terms of a signal-to-noise ratio S/N.

When the signal charge accumulated in the charge accumulation portion is defined as Sx, and light shot noise is defined as Nx, the light shot noise can be represented as $Nx=\sqrt{Sx}$. That is, since the signal-to-noise ratio can be represented as $S/N=Sx/\sqrt{Sx}=\sqrt{Sx}$, increasing the largest amount of the signal charge Sx can increase S/N.

As described above, in one example of the present embodiment, electrically connecting the photoelectric converting portion 15 and the first capacitance element 71 can increase the largest amount of signal charge (the amount of saturation charge) that can be accumulated in the charge accumulation portion, can address highlight clipping, and can improve signal-to-noise (S/N),

[Reduction in Leakage Current]

Figure 3:
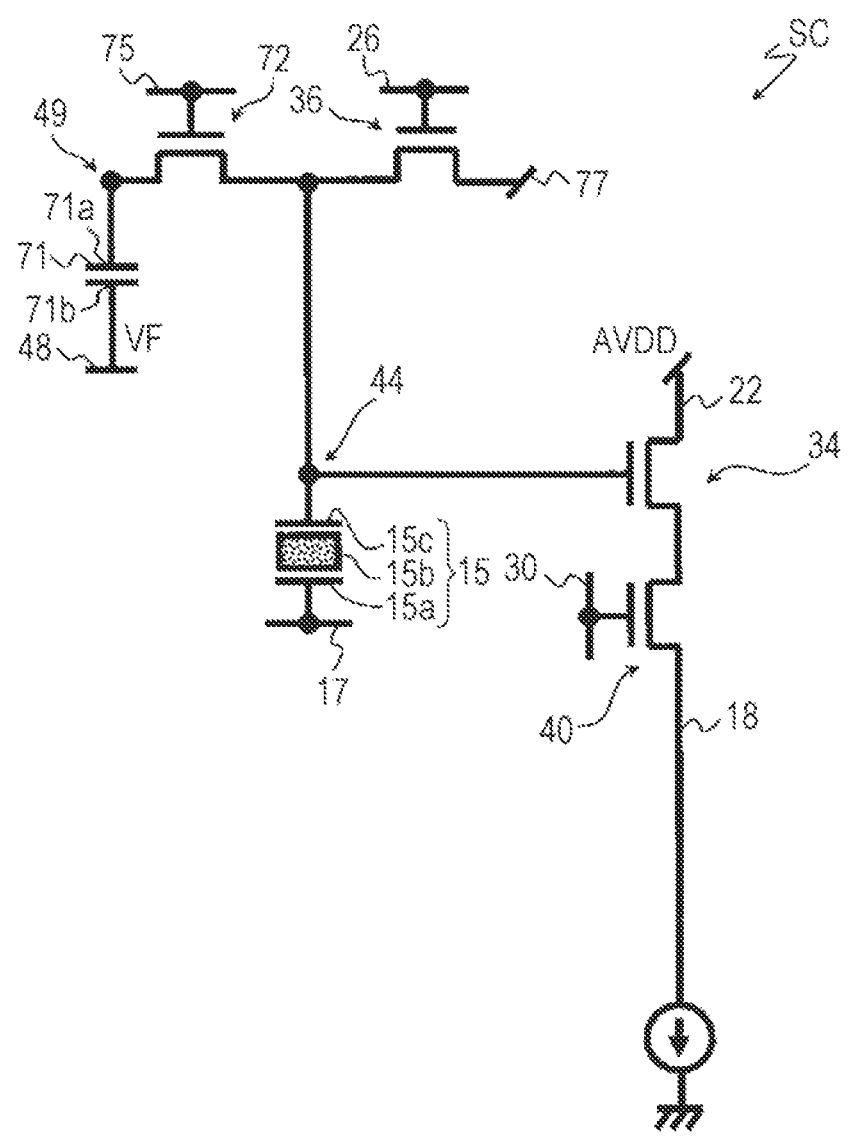
FIG. 3 is a schematic diagram illustrating a circuit configuration according to a comparative example.

Assume that the connection of the first capacitance element 71 and the sensitivity switching transistor 72 is opposite to that in FIG. 2, and the first capacitance element 71 and the sensitivity switching transistor 72 are sequentially connected from the fixed potential portion 48 toward the charge accumulation node 44. A state in which this connection is made is illustrated in FIG. 3. In a comparative example illustrated in FIG. 3, a portion between the first capacitance element 71 and the sensitivity switching transistor 72 is a floating portion 49 whose potential is not fixed. In the period in which the sensitivity switching transistor 72 is off, signal charge that flows into the first capacitance element 71 when the sensitivity switching transistor 72 is on may be accumulated therein. When the sensitivity switching transistor 72 is turned on during the accumulation of the signal charge in the first capacitance element 71, a large leakage current may flow between the drain and the source of the sensitivity switching transistor 72. Also, it may take time for the leakage current to converge. Such leakage current can reduce the image quality. In this context, the "leakage current" refers to current that is generated not due to signal charge generation by photoelectric conversion.

In contrast, in the sensitivity switching circuit GSC illustrated in FIG. 2, it is difficult for a large leakage current to flow between the drain and the source of the sensitivity switching transistor 72. Also, since a state in which the fixed potential VF is supplied to the drain or the source of the sensitivity switching transistor 72 is maintained, the leakage current converges immediately even when the leakage current occurs between the drain and the source of the sensitivity switching transistor 72 while the sensitivity switching transistor 72 is turned on. An image quality reduction associated with the leakage current when the sensitivity switching transistor 72 is turned on is less likely to occur. Thus, the sensitivity switching circuit GSC illustrated in FIG. 2 is suitable for suppressing a noise increase associated with the leakage current and for obtaining a high dynamic range.

[Miniaturization]

The combination of the sensitivity switching transistor 72 and the first capacitance element 71 can be provided without incurring a considerable increase in the size of each pixel. That is, employment of the sensitivity switching circuit GSC is advantageous from the perspective of miniaturization of the imaging device 101.

Next, one example of the operation of the imaging device 101 will be described with reference to the drawings.

First, a description will be given of an overview of the operation of the imaging device 101 in the first mode. As described above, the first mode is a mode in which the sensitivity is relatively high. The first mode is a mode suitable for imaging under low illuminance. Under low illuminance, high sensitivity is beneficial.

Figure 4:
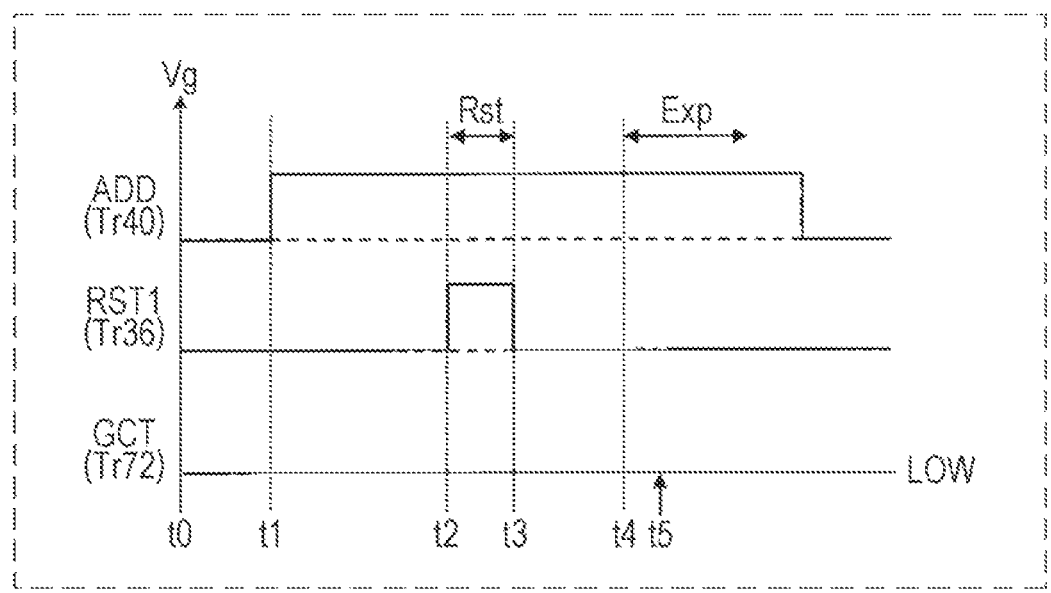
FIG. 4 is a timing chart for describing one example of the operations of transistors in a first mode, the transistors being included in the imaging device according to the first embodiment.

FIG. 4 is a timing chart for describing one example of the operations of the transistors in the first mode. In FIG. 4, ADD, RST1, and GCT schematically show examples of changes in a gate voltage of the address transistor 40, changes in a gate voltage of the first reset transistor 36, and changes in a gate voltage of the sensitivity switching transistor 72. In the example illustrated in FIG. 4, at time t0, all of the address transistor 40, the first reset transistor 36, and the sensitivity switching transistor 72 are off. A description of the operation of an electronic shutter is omitted below, for simplicity.

First, at time t1, the potential of the address signal line 30 is controlled to thereby turn on the address transistor 40. At this point in time, signal charge accumulated in the charge accumulation portion is read out.

Next, at time t2, the potential of the reset signal line 26 is controlled to thereby turn on the first reset transistor 36. Thus, the reset voltage Vr is supplied from the reset voltage line 77 to the charge accumulation portion, so that the potential of the charge accumulation portion is reset. The reset voltage Vr is, for example, 1 V. The reset voltage Vr may be 0 V, depending on a threshold Vt of the amplifying transistor 34. In this case, the "threshold Vt" refers to a voltage across the gate and the source of the amplifying transistor 34 when drain current starts flowing thereto.

Next, at time t3, the first reset transistor 36 is turned off. Hereinafter, a period from when the first reset transistor 36 is turned on at time t2 until the first reset transistor 36 is turned off may be referred to as a "reset period". In FIG. 4, the reset period is a period from time t2 to time t3. In FIG. 4, the reset period is schematically denoted by arrow Rst.

Next, at time t4, exposure is started. In the illustrated example, a time lag exists from when the first reset transistor 36 is turned off until the exposure is started. However, the exposure may also be started simultaneously with turning off the first reset transistor 36.

In FIG. 4, the period of the exposure is schematically denoted by arrow Exp. A reset voltage is read out at a predetermined timing in the period of the exposure. This timing corresponds to time t5. Since the time taken for reading out the reset voltage is a short time, the readout of the reset voltage may be executed while the on state of the address transistor 40 continues.

A difference between a signal read out between time t1 and time t2 and a signal read out at time t5 is determined to thereby obtain a signal from which fixed noise is eliminated. A signal from which the fixed noise is eliminated is obtained in the manner described.

In the first mode, a voltage is not supplied from the switching control line 75 to the gate of the sensitivity switching transistor 72, The gate voltage is maintained at a low level, and the sensitivity switching transistor 72 is maintained in the off state Thus, the state in which the first capacitance element 71 is not virtually seen as a capacitance is maintained, and the state in which the sensitivity is relatively high is maintained.

Next, an overview of the operation of the imaging device 101 in the second mode will be described with reference to FIG. 5. As described above, the second mode is a mode in which the sensitivity is relatively low. The second mode is a mode that is suitable for imaging under high illuminance. Under high illuminance, low sensitivity is beneficial Descriptions that are the substantially the same as those in the first mode may be omitted below.

Figure 5:
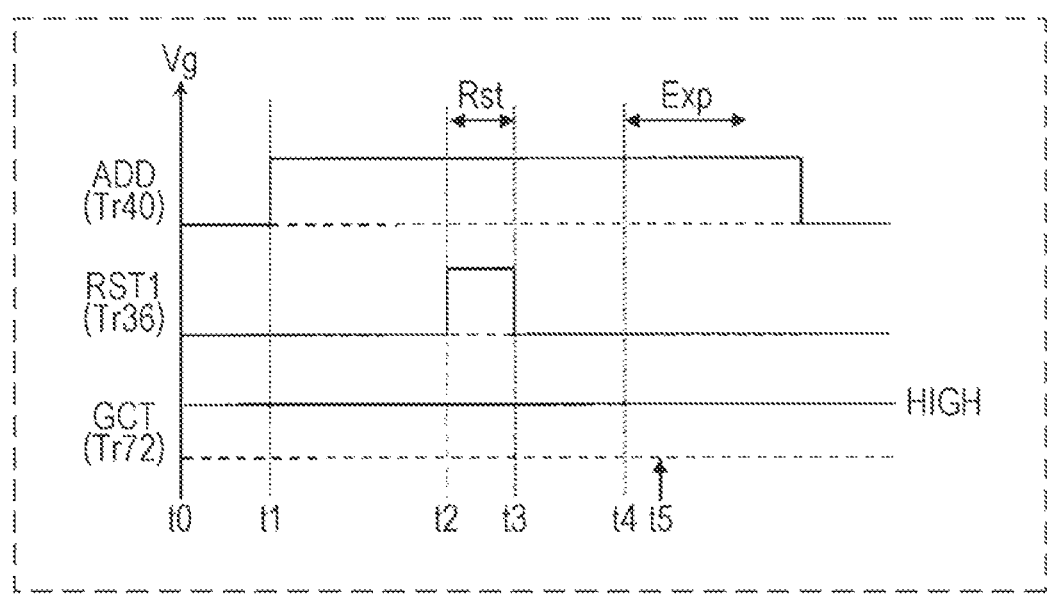
FIG. 5 is a timing chart for describing one example of the operations of the transistors in a second mode, the transistors being included in the imaging device according to the first embodiment.

FIG. 5 is a timing chart for describing one example of the operations of the transistors in the second mode. In the second mode, a voltage is supplied from the switching control line 75 to the gate of the sensitivity switching transistor 72, The gate voltage is maintained at a high level, and the sensitivity switching transistor 72 is maintained in the on state. Thus, the state in which the first capacitance element 71 is seen as a capacitance is maintained, and the state in which the sensitivity is relatively low is maintained.

Figure 6:
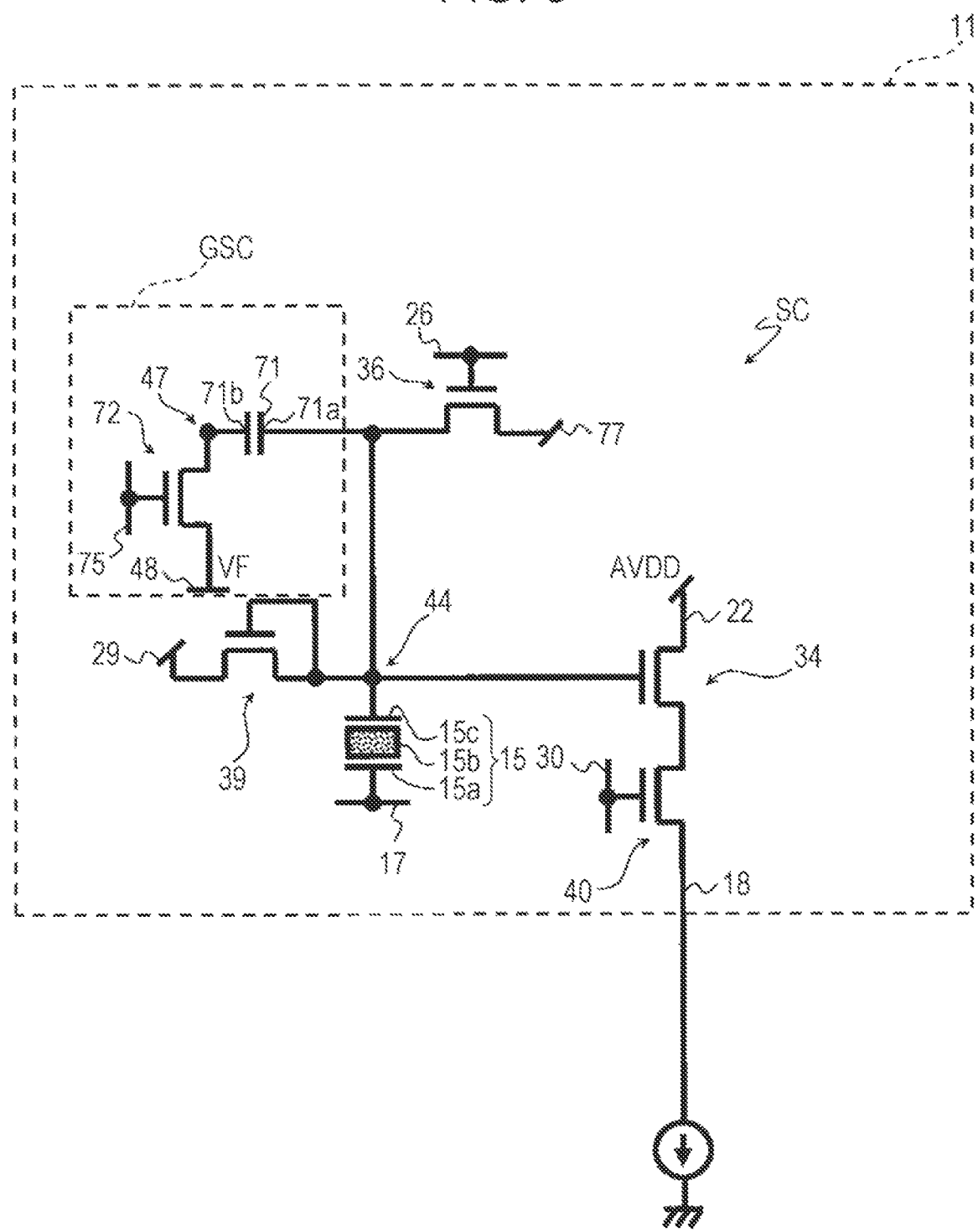
FIG. 6 is a schematic diagram illustrating a circuit configuration according to a modification.

Various changes can be made to the first embodiment. In one modification, the pixel 11 has an overflow transistor 39, as illustrated in FIG. 6. One of a source and a drain of the overflow transistor 39 and a gate thereof are connected to the charge accumulation node 44. The other of the source and the drain of the overflow transistor 39 is connected to a charge collection line 29. When the amount of signal charge accumulated in the charge accumulation portion exceeds a predetermined size, and the potential of the charge accumulation portion exceeds a predetermined potential, the overflow transistor 39 is turned on, Thus, excessive signal charge in the charge accumulation portion is discharged to the charge collection line 29 via the source and the drain of the overflow transistor 39.

Some other embodiments will be described below. Hereinafter, elements that are common to those in the embodiment described above and those in embodiments described below are denoted by the same reference numerals, and descriptions thereof may be omitted. Descriptions of the individual embodiments can be applied to each other, as long as they are not technically contradictory. The embodiments may also be combined with each other, as long as such a combination is not technically contradictory.

Second Embodiment

Figure 7:
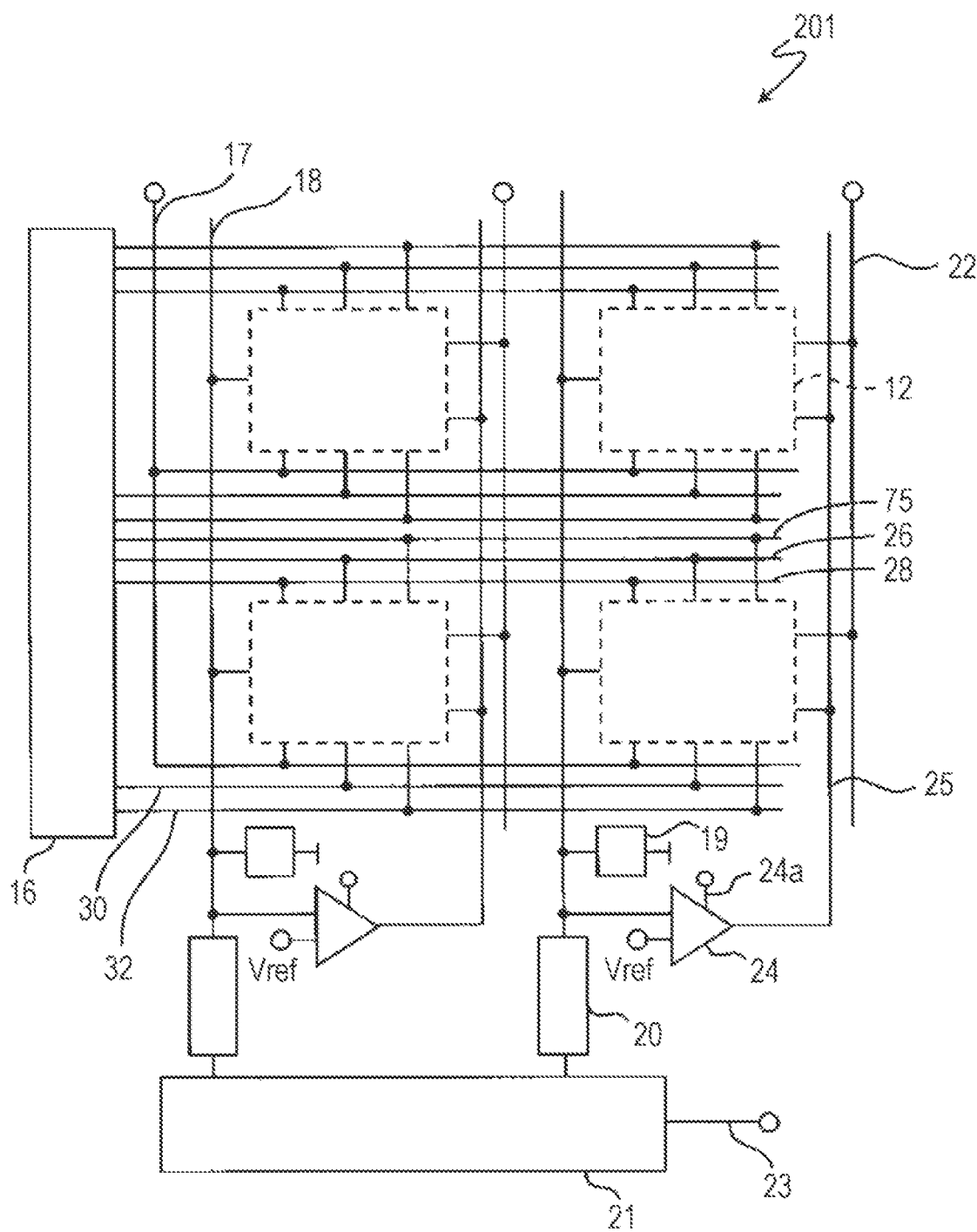
FIG. 7 is a schematic diagram illustrating an exemplary circuit configuration of an imaging device according to a second embodiment.

FIG. 7 schematically illustrates an exemplary circuit configuration of an imaging device 201 according to a second embodiment.

Peripheral circuitry of the imaging device 201 includes inverting amplifiers 24. In the illustrated configuration, the inverting amplifiers 24 are arranged for the respective columns of pixels 12 that are two-dimensionally arrayed. That is, in this example, the peripheral circuitry includes two or more inverting amplifiers 24.

In the second embodiment, the vertical scanning circuit 16 also selects the pixels 12, arranged in the rows, row by row by applying a predetermined voltage to the address signal lines 30. Then, in the second embodiment, the readout of the signal voltages of the selected pixels 12 and reset of the pixel electrodes 15c are executed.

In the illustrated example, the vertical scanning circuit 16 is also connected to feedback control lines 28 and control lines 32. When the vertical scanning circuit 16 applies a predetermined voltage to the feedback control line 28, it is possible to form a feedback circuit for negatively feeding back an output of the pixel 12, as described below. Also, the vertical scanning circuit 16 can supply a predetermined voltage to the pixels 12 through the control lines 32.

In the configuration illustrated in FIG. 7, two or more power-supply wires 22 are provided so as to correspond to the respective columns. The power-supply wire 22 in each column is connected to the pixels 12 in the column.

In the configuration illustrated in FIG. 7, the inverting amplifiers 24 are provided so as to correspond to the respective columns. A negative-side input terminal of each inverting amplifier 24 is connected to the corresponding vertical signal line 18. A predetermined voltage (e.g., a positive voltage of 1 V or close to 1 V) Vref is supplied to a positive-side input terminal of the inverting amplifier 24. Also, an output terminal of the inverting amplifier 24 is connected to one or more pixels 12 through a feedback line 25 provided so as to correspond to the column, the one or more pixels having connections with the negative-side input terminal of the inverting amplifier 24. The inverting amplifier 24 constitutes a portion of a feedback circuit for negatively feeding back an output from the pixel 12. The inverting amplifier 24 may also be called a feedback amplifier. The inverting amplifier 24 includes a gain adjustment terminal 24a for changing an inversion amplification gain. The operation of the inverting amplifier 24 will be described below.

Figure 8:
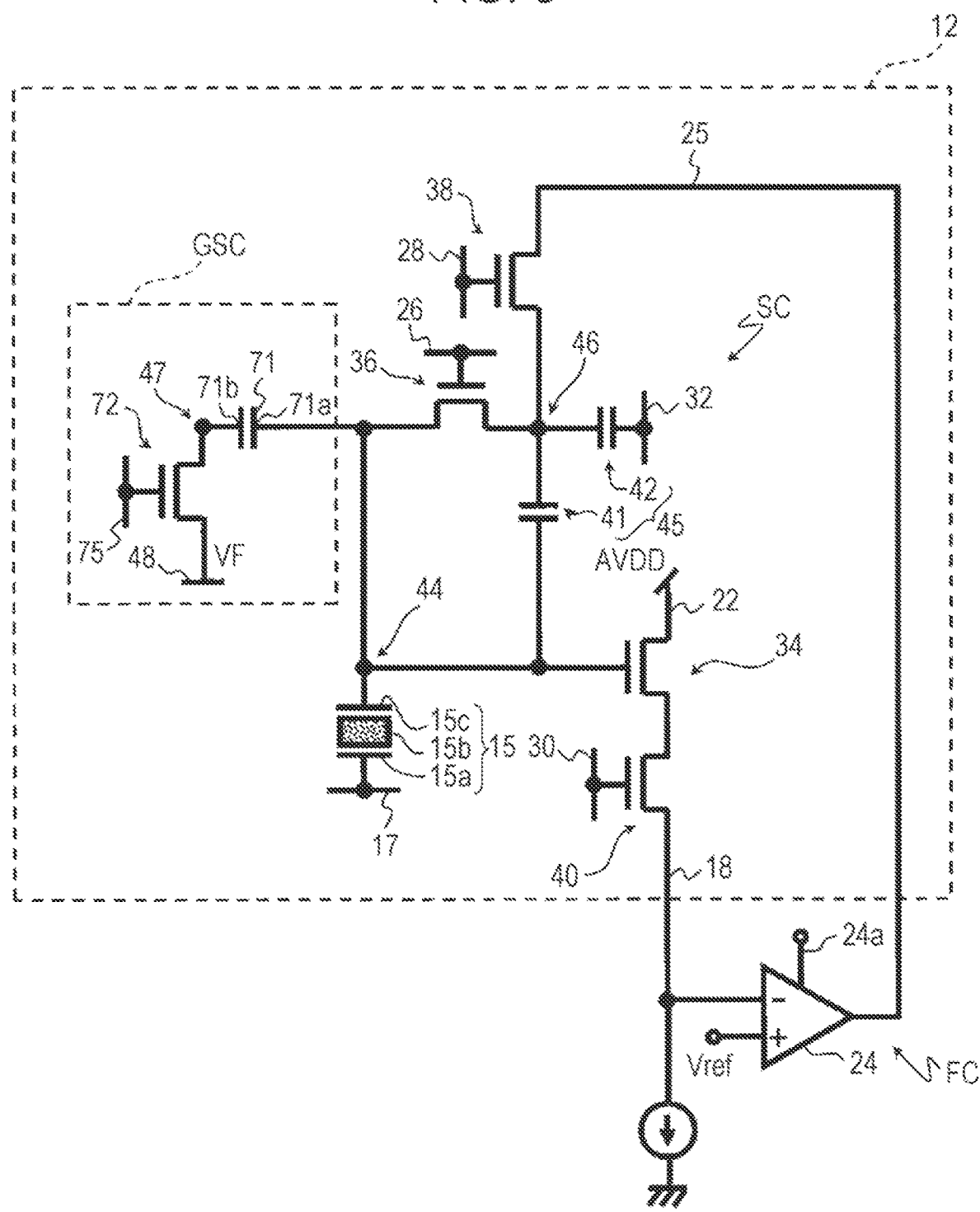
FIG. 8 is a schematic diagram illustrating an exemplary circuit configuration of pixels illustrated in FIG. 7.

FIG. 8 illustrates an exemplary circuit configuration of the pixels 12 illustrated in FIG. 7.

Each pixel 12 includes a capacitance circuit 45 in which a second capacitance element 41 and a third capacitance element 42 are connected in series. In the illustrated configuration, the third capacitance element 42 has a capacitance value that is larger than that of the second capacitance element 41. In the configuration illustrated in FIG. 8, one of the source and the drain of the first reset transistor 36 and one electrode of the second capacitance element 41 are connected to the charge accumulation node 44. That is, one of the source and the drain of the first reset transistor 36 and one electrode of the second capacitance element 41 have electrical connections with the pixel electrode 15c.

The other of the source and the drain of the first reset transistor 36 and another electrode of the second capacitance element 41 are connected to one electrode of the third capacitance element 42. That is, in this example, the second capacitance element 41 is connected in parallel with the first reset transistor 36. Connecting the second capacitance element 41 and the first reset transistor 36 in parallel with each other can reduce transistor junction leakage to the charge accumulation node 44. Accordingly, it is possible to reduce dark current. A node including a connection point of the second capacitance element 41 and the third capacitance element 42 may hereinafter be referred to as a "reset drain node 46".

Of terminals of the third capacitance element 42, a terminal that is not connected to the reset drain node 46 is connected to the control line 32. The control line 32 is used to control the potential of the terminal. The potential of the control line 32 is set to, for example, 0 V (a reference potential). The potential of the control line 32 does not have to be fixed during operation of the imaging device 201. For example, a pulse voltage may be supplied from the vertical scanning circuit 16. The control line 32 can be used to control the potential of the charge accumulation node 44, as described below. Naturally, during operation of the imaging device 201, the potential of the control line 32 may be fixed.

In the configuration illustrated in FIG. 8, the pixel 12 includes a second reset transistor 38 in which one of a source and a drain is connected to the reset drain node 46, and the other of the source and the drain is connected to the feedback line 25. That is, in the illustrated configuration, one of the source and the drain of the first reset transistor 36, the one being connected to the reset drain node 46, and the feedback line 25 are connected to each other via the second reset transistor 38. A gate of the second reset transistor 38 is connected to the feedback control line 28. As described below in detail, controlling the voltage of the feedback control line 28 makes it possible to form a feedback circuit FC for feeding back an output of the signal detection circuit SC. In the feedback in this example, an output of the signal detection circuit SC is negatively fed back.

The second reset transistor 38 may be an N-channel MOS or a P-channel MOS. The second reset transistor 38 and the other transistors do not have to be unified to either N-channel MOSs or P-channel MOSs. A case in which the second reset transistor 38 is an N-channel MOS will be described below by way of example.

(Overview of Operation of Imaging Device 201)

Next, one example of the operation of the imaging device 201 will be described with reference to the drawings. As described below, according to the configuration illustrated in FIG. 8, appropriately controlling gate voltages of the first reset transistor 36 and the second reset transistor 38 makes it possible to switch between photography modes in which the sensitivities are different from each other.

As in the first embodiment, the photography modes include a first mode and a second mode. The first mode is a mode in which imaging can be performed with relatively high sensitivity. The second mode is a mode in which imaging can be performed with relatively low sensitivity.

First, an overview of the operation of the imaging device 201 in the first mode will be described. As described above, the first mode is a mode in which the sensitivity is relatively high. The first mode is a mode that is suitable for imaging under low illuminance. Under low illuminance, high sensitivity is beneficial.

Figure 9:
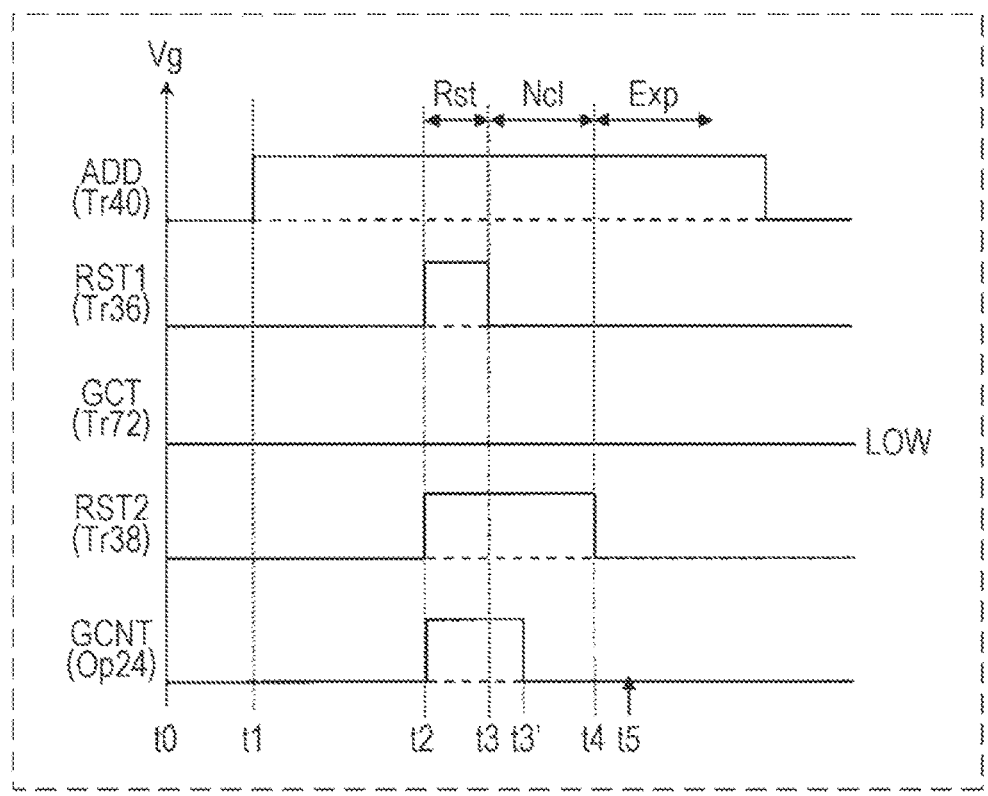
FIG. 9 is a timing chart for describing one example of the operations of transistors in the first mode, the transistors being included in the imaging device according to the second embodiment.

FIG. 9 is a timing chart for describing one example of the operation of the transistors in the first mode. In FIG. 9, RST2 and GCNT schematically show examples of changes in the gate voltage of the second reset transistor 38 and changes in a voltage applied to the gain adjustment terminal 24a of the inverting amplifier 24, respectively. In the example illustrated in FIG. 9, at time t0, the second reset transistor 38 is off. Also, the voltage at the gain adjustment terminal 24a of the inverting amplifier 24 has a predetermined value.

First, at time t1, the potential of the address signal line 30 is controlled to thereby turn on the address transistor 40. At this point in time, the signal charge accumulated in the charge accumulation portion is read out.

Next, at time t2, the potentials of the reset signal line 26 and the feedback control line 28 are controlled to thereby turn on the first reset transistor 36 and the second reset transistor 38. Thus, the charge accumulation node 44 and the feedback line 25 are connected to each other through the first reset transistor 36 and the second reset transistor 38 to form the feedback circuit FC for negatively feeding back an output of the signal detection circuit SC. Since the second reset transistor 38 is interposed between the reset drain node 46 and the feedback line 25, the second reset transistor 38 selectively forms the feedback circuit FC to thereby allow a signal of the photoelectric converting portion 15 to be fed back.

In this example, the formation of the feedback circuit FC is executed on one of the pixels 12 that share the feedback line 25, Controlling the gate voltage of the address transistor 40 makes it possible to select the pixel 12 for which the feedback circuit FC is to be formed and to execute resetting and/or noise canceling described below on the desired pixel 12.

In this case, the feedback circuit FC is a negative feedback amplification circuit including the amplifying transistor 34, the inverting amplifier 24, and the second reset transistor 38. The address transistor 40 that is turned on at time supplies an output of the amplifying transistor 34 as an input to the feedback circuit FC.

When the charge accumulation node 44 and the feedback line 25 are electrically connected to each other, the charge accumulation portion is reset. At this point in time, an output of the signal detection circuit SC is negatively fed back, so that the voltage of the vertical signal line 18 converges to a voltage Vref applied to the positive-side input terminal of the inverting amplifier 24. That is, in this example, a reference voltage for the resetting is the voltage Vref. In the configuration illustrated in FIG. 8, the voltage Vref can be arbitrarily set to a voltage in the range of a power-supply voltage (e.g., 3.3 V) to ground (0 V). In other words, an arbitrary voltage can be used as the reference voltage for the resetting, as long as it is in a certain range. For example, a voltage other than the power-supply voltage can be used as the reference voltage for the resetting.

Also, at time t2, the potential of the gain adjustment terminal 24a of the inverting amplifier 24 is controlled to reduce the gain of the inverting amplifier 24. In the inverting amplifier 24, since a product G×B of a gain G and a band B is constant, the reduction in the gain G widens the band B. Thus, the above-described convergence in the negative feedback amplification circuit can be sped up. The "widening of the band B" means an increase in a cutoff frequency.

Next, at time t3, the first reset transistor 36 is turned off. A period from when the first reset transistor 36 and the second reset transistor 38 are turned on at time t2 until the first reset transistor 36 is turned off may hereinafter be referred to as a "reset period". In FIG. 9, the reset period is a period from time t2 to time t3, In FIG. 9, the reset period is schematically denoted by arrow Rst. As a result of turning off the first reset transistor 36 at time t3, kTC noise is generated. Thus, the kTC noise is added to the voltage of the charge accumulation portion after the resetting.

As can be understood by referring to FIG. 8, the state in which the feedback circuit FC is formed continues during a period in which the second reset transistor 38 is on. Thus, the kTC noise generated as a result of turning off the first reset transistor 36 at time t3 is canceled to the size 1/(1+A), where A is the gain of the feedback circuit FC.

In this example, the voltage of the vertical signal line 18 immediately before the first reset transistor 36 is turned off (i.e., immediately before the noise canceling is started) is substantially equal to the voltage Vref applied to the negative-side input terminal of the inverting amplifier 24. The voltage of the vertical signal line 18 at the time of starting the noise canceling is brought close to the target voltage Vref after the noise canceling, as described above, to thereby allow the kTC noise to be canceled in a relatively short time. A period from when the first reset transistor 36 is turned off until the second reset transistor 38 is turned off may hereinafter be referred to as a "noise cancel period". In FIG. 9, the noise cancel period is a period from time t3 to time t4. In FIG. 9, the noise cancel period is schematically denoted by arrow Ncl.

Also, at time t3, the gain of the inverting amplifier 24 is in a reduced state. Thus, in an early stage of the noise cancel period, the noise canceling can be performed at high speed.

Subsequently, at time t3', the potential of the gain adjustment terminal 24a of the inverting amplifier 24 is controlled to increase the gain of the inverting amplifier 24. This further reduces the noise level. In this case, since the product G×B of the gain G and the band B is constant, the increase in the gain G narrows the band B. That is, it takes time for the convergence in the negative feedback amplification circuit. However, since the voltage of the vertical signal line 18 is already controlled to be near a convergence level in a period of t3 to t3', the width of the voltage that is to be converged decreases, thus making it possible to suppress a convergence time increase due to the narrowing of the band. The "narrowing of the band B" means a reduction in the cutoff frequency.

Thus, according to the second embodiment, the kTC noise generated as a result of turning off the first reset transistor 36 can be reduced, and the generated kTC noise can be canceled in a relatively short time.

Next, at time t4, the second reset transistor 38 is turned off, and exposure is executed for a predetermined period of time. As a result of turning off the second reset transistor 38 at time t4, kTC noise is generated. The magnitude of kTC noise added to the voltage of the charge accumulation portion at this point in time is about $(Cfd/C2)^{1/2} \times (C1/(C1+Cfd))$ times of the magnitude of kTC noise in a case in which the second reset transistor 38 is directly connected to the charge accumulation node 44 without provision of the second capacitance element 41 and the third capacitance element 42 in the pixel 12. In the mathematical expression noted above, Cfd, C1, and C2 represent a capacitance value of the charge accumulation node 44, a capacitance value of the second capacitance element 41, and a capacitance value of the third capacitance element 42, respectively. In the mathematical expression, "×" represents multiplication. Thus, the larger the capacitance value C2 of the third capacitance element 42 is, the smaller the amount of noise that is generated, and the smaller the capacitance value C1 of the second capacitance element 41 is, the higher the decay rate is. Therefore, according to the second embodiment, appropriately setting the capacitance value C1 of the second capacitance element 41 and the capacitance value C2 of the third capacitance element 42 makes it possible to sufficiently reduce the kTC noise that is generated as a result of turning off the second reset transistor 38.

In FIG. 9, the period of the exposure is schematically denoted by arrow Exp. A reset voltage resulting from canceling the kTC noise is read out at a predetermined timing in the period of the exposure. This timing corresponds to time t5. Since the time taken for reading out the reset voltage is a short time, the readout of the reset voltage may be executed while the on state of the address transistor 40 continues.

A difference between a signal read out between time t1 and time t2 and a signal read out at time t5 is determined to thereby obtain a signal from which fixed noise is eliminated. A signal from which the kTC noise and the fixed noise are eliminated is obtained in the manner described above.

In a state in which the first reset transistor 36 and the second reset transistor 38 are turned off, the third capacitance element 42 is connected to the charge accumulation node 44 via the second capacitance element 41. Now, suppose a case in which the charge accumulation node 44 and the third capacitance element 42 are directly connected to each other without involvement of the second capacitance element 41. In this case, the capacitance value of an entire accumulation region of the signal charge when the third capacitance element 42 is directly connected is (Cfd+C2). That is, when the third capacitance element 42 has a relatively large capacitance value C2, the capacitance value of the entire accumulation region of the signal charge also becomes a large value, and thus a large conversion gain (which may also be said to be a high S/N ratio) is not obtained. Accordingly, in the embodiment of the present disclosure, the third capacitance element 42 is connected to the charge accumulation node 44 via the second capacitance element 41. The capacitance value of the entire accumulation region of the signal charge is generally represented as (Cfd+(C1C2)/(C1+C2)) in a configuration as described above. In this case, when the second capacitance element 41 has a relatively small capacitance value C1, and the third capacitance element 42 has a relatively large capacitance value C2, the capacitance value of the entire accumulation region of the signal charge is approximately (Cfd+C1). That is, an increase in the capacitance value of the entire accumulation region of the signal charge is small. Thus, connecting the third capacitance element 42 to the charge accumulation node 44 via the second capacitance element 41 having a relatively small capacitance value makes it possible to suppress a reduction in the conversion gain.

In the first mode, a voltage is not supplied from the switching control line 5 to the gate of the sensitivity switching transistor 72. The gate voltage is maintained at a low level, and the sensitivity switching transistor 72 is maintained in the off state. Thus, the state in which the first capacitance element 71 is not virtually seen as a capacitance is maintained, and the state in which the sensitivity is relatively high is maintained.

Next, an overview of the operation of the imaging device 201 in the second mode will be described with reference to FIG. 10. As described above, the second mode is a mode in which the sensitivity is relatively low. The second mode is a mode that is suitable for imaging under high illuminance. Under high illuminance, low sensitivity is beneficial. Descriptions that are substantially the same as those in the first mode may be omitted below.

Figure 10:
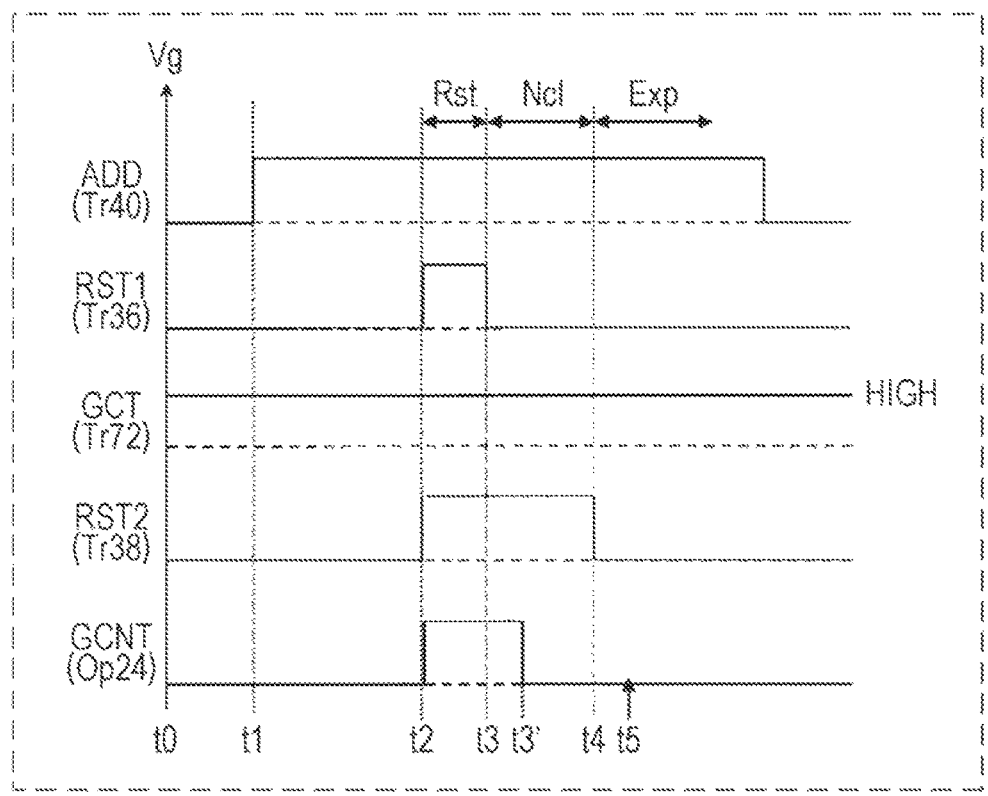
FIG. 10 is a timing chart for describing one example of the operations of the transistors in the second mode, the transistors being included in the imaging device according to the second embodiment.

FIG. 10 is a timing chart for describing one example of the operations of the transistors in the second mode. In the second mode, a voltage is supplied from the switching control line 75 to the gate of the sensitivity switching transistor 72. The gate voltage is maintained at a high level, and the sensitivity switching transistor 72 is maintained in the on state. Thus, the state in which the first capacitance element 71 is seen as a capacitance is maintained, and the state in which the sensitivity is relatively low is maintained.

In the second mode, the first capacitance element 71 is seen as a capacitance, as described above. Thus, the quantitative discussion using C1, C2, and Cfd in the first mode is changed to a discussion considering the first capacitance element 71 in the second mode.

Third Embodiment

Figure 11:
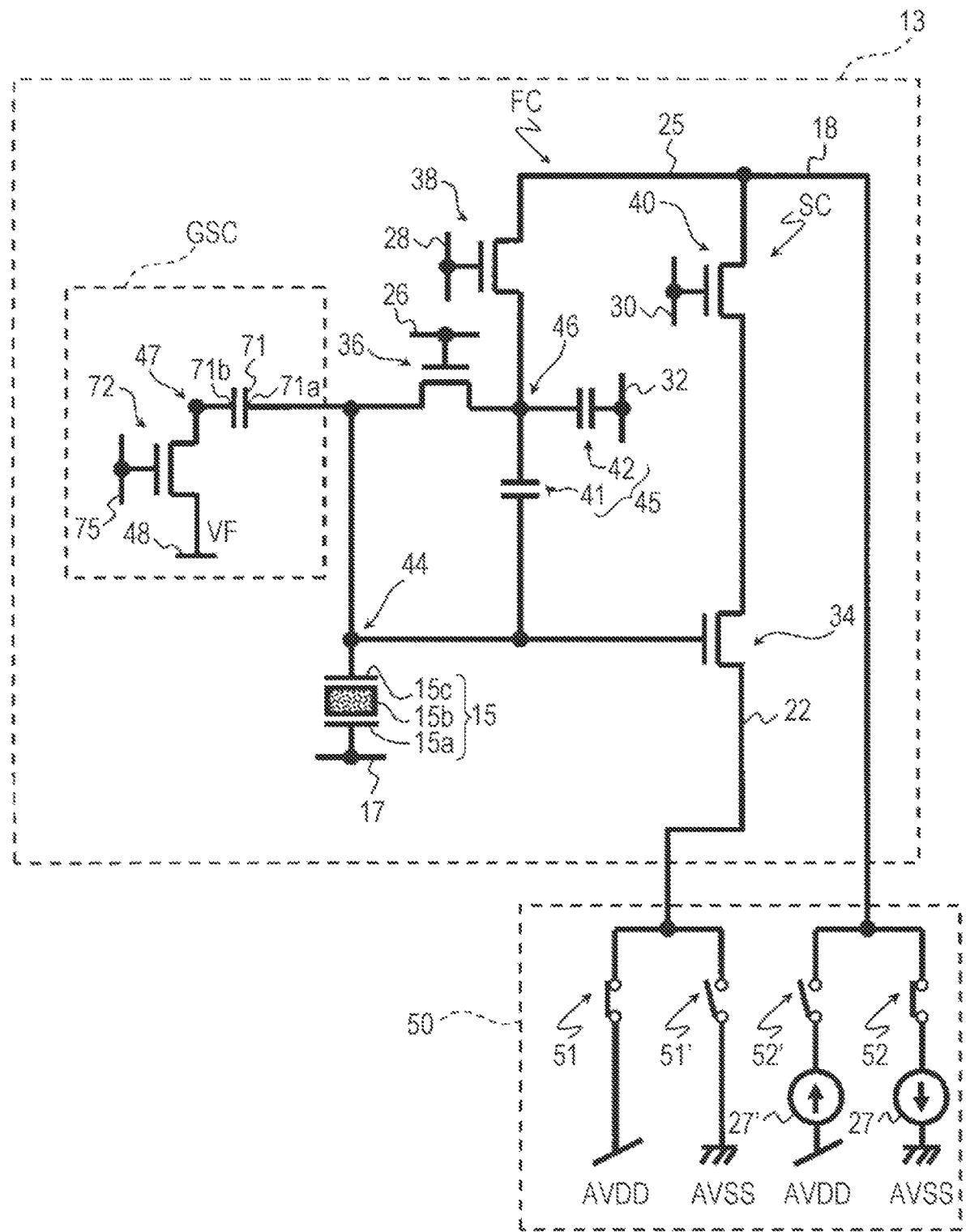
FIG. 11 is a schematic diagram illustrating an exemplary circuit configuration of an imaging device according to a third embodiment.

FIG. 11 schematically illustrates an exemplary circuit configuration of a pixel 13 in an imaging device according to a third embodiment. As illustrated in FIG. 11, the imaging device in the third embodiment differs from the imaging device 201 in the second embodiment in that switching circuits 50, instead of the inverting amplifiers 24, are provided for respective columns of the pixels 13. Thus, in two or more pixels 13 that constitute each column in the imaging device according to the third embodiment, each feedback line 25 does not provide connection between the pixels 13.

In each pixel 13, the feedback line 25 is connected to either a source or a drain included in the second reset transistor 38 and not connected to the reset drain node 46. The address transistor 40 is provided between either the source or the drain of the amplifying transistor 34 and the feedback line 25. The source or the drain included in the address transistor 40 and connected to the feedback line 25 is connected to the vertical signal line 18. Points that differ from the imaging device 201 in the second embodiment will be mainly described below.

The switching circuit 50 includes switching elements 51 and 51' connected in parallel with the power-supply wire 22 and switching elements 52' and 52 connected in parallel with the vertical signal line 18. The switching elements 51 and 51' are connected to a power-supply voltage (AVDD) and a reference potential (AVSS), respectively. Also, the switching elements 52' and 52 are connected to the power-supply voltage (AVDD) and the reference potential (AVSS) via constant current sources 27' and 27, respectively.

For the signal readout, a voltage is applied to the gate of the address transistor 40 through the address signal line 30 to thereby select one of the pixels 13 in each column. Also, the switching elements 51 and 52 in the switching circuit 50 are turned on, for example, so that current in a direction from the amplifying transistor 34 toward the address transistor 40 flows from the constant current source 27, and the potential of the charge accumulation portion which is amplified by the amplifying transistor 34 is detected.

Meanwhile, for a reset operation, the switching element 51' and the switching element 52' in the switching circuit 50 are turned on, so that current in a direction opposite to that for the signal readout flows to the address transistor 40 and the amplifying transistor 34. This constitutes a feedback circuit FC including the amplifying transistor 34, the address transistor 40, the feedback line 25, the second reset transistor 38, and the first reset transistor 36. At this point in time, since the address transistor 40 and the amplifying transistor 34 are connected in cascode, a large gain can be obtained. Thus, the feedback circuit FC can perform noise canceling with a large gain.

The imaging device in the present embodiment can reduce kTC noise, as in the second embodiment.

Also, according to the imaging device in the present embodiment, the inverting amplifier 24 is not provided, and the address transistor 40 and the amplifying transistor 34 serve as both the signal detection circuit SC and an amplifier for the feedback circuit FC. Thus, it is possible to reduce the area that occupies the circuitry in the imaging device. Also, it is possible to reduce power consumed by the imaging device. In addition, since a large gain can be obtained by the cascode connection, kTC noise can be reduced even when the capacitances of the second capacitance element 41 and the third capacitance element 42 are small.

(Number of Vertical Signal Lines 18 and Number of Feedback Lines 25)

In FIGS. 1 and 7, one vertical signal line 18 is provided for each column. However, two or more vertical signal lines 18 can also be provided for each column. For example, when a pixel array having a Bayer arrangement is constituted in the photosensitive region, pixels for two types of color that are different from each other are alternately arranged in each column. In each column, it is conceivable to provide one or more vertical signal lines 18 for passing signals read out from pixels of one color and providing one or more vertical signal lines 18 for passing signals read out from pixels of another color. Also, in FIG. 7, one feedback line 25 is provided for each column. However, similarly, two or more feedback lines 25 may be provided for each column.

When two or more vertical signal lines 18 are provided for each column, two or more vertical signal lines 18 may pass through one pixel. Similarly, when two or more feedback lines 25 are provided for each column, two or more feedback lines 25 may pass through one pixel.

FIGS. 12 to 28 described below illustrate examples in which two vertical signal lines 18 and two feedback lines 25 pass through one pixel. One of the two vertical signal lines 18 is referred to as a "vertical signal line 18*j*", and the other vertical signal line 18 is referred to as a "vertical signal line 18*k*". One of the two feedback lines 25 is referred to as a "feedback line 25*j*", and the other feedback line 25 is referred to as a "feedback line 25*k*". However, the number of vertical signal lines 18 that pass through one pixel may be one or may be three or more. The same also applies to the number of feedback lines 25 that pass through one pixel.

As in the above description, a pixel that is described with reference to FIGS. 12 to 28 can be referred to as a "first pixel", for the sake of convenience.

(First Example of Structure of Pixel)

FIGS. 12 to 17 schematically illustrate a first example of the structure of a pixel that can be applied to the second and third embodiments.

A first adjacent pixel and a second adjacent pixel are adjacent to the pixel illustrated in FIGS. 12 to 17. FIGS. 12 to 17 illustrate the positions of the first adjacent pixel and the second adjacent pixel.

The first capacitance element 71 in the first example has a MOM structure. The "MOM structure" refers to a structure in which a dielectric formed of an oxide is provided between two electrodes formed of metal or a metal compound. In a capacitance element having a MOM structure, a parasitic capacitance between wires is utilized as a capacitance of the capacitance element.

The third capacitance element 42 in the first example has a metal-insulator-metal (MIM) structure. The "MIM structure" refers to a structure in which a dielectric is sandwiched between two electrodes formed of metal or a metal compound.

Figure 12:
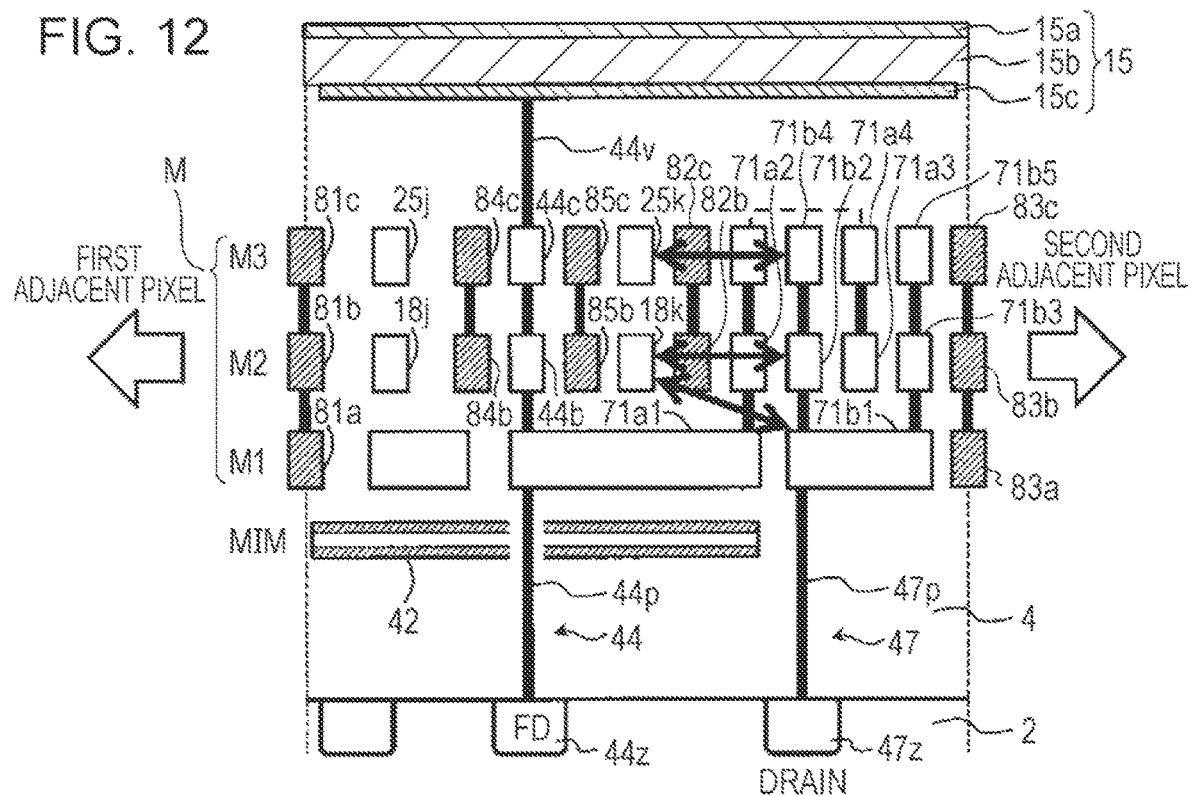
FIG. 12 is a schematic diagram illustrating the structure of a pixel according to a first example.

FIG. 12 schematically illustrates a section of the pixel in the first example, the section being parallel to a thickness direction of a semiconductor substrate 2. As illustrated in FIG. 12, the semiconductor substrate 2, an insulating layer 4, and the photoelectric converting portion 15 are stacked in that order. In the insulating layer 4, a wire region M and the third capacitance element 42 are provided. The third capacitance element 42 is provided between the wire region M and the semiconductor substrate 2. However, the third capacitance element 42 may also be provided between the wire region M and the photoelectric converting portion 15. The wire region M includes wiring layers M1, M2, and M3. The wiring layers M1, M2, and M3 are provided in that order with respect to the thickness direction of the semiconductor substrate 2. In this example, the number of wiring layers is three. However, the number of wiring layers may be one, may be two, or may be four or more.

As illustrated in FIG. 12, the wiring layer M1 includes a shield wire 81*a*, terminal wires 71*a*1 and 71*b*1, and a shield wire 83*a*. The wiring layer M2 includes a shield wire 81*b*, the vertical signal line 18*j*, a shield wire 84*b*, an FD wire 44*b*, a shield wire 85*b*, the vertical signal line 18*k*, a shield wire 82*b*, a terminal wire 71*a*2, a terminal wire 71*b*2, a terminal wire 71*a*3, a terminal wire 71*b*3, and a shield wire 83*b*. The wiring layer M3 includes a shield wire 81*c*, the feedback line 25*j*, a shield wire 84*c*, an FD wire 44*c*, a shield wire 85*c*, the feedback line 25*k*, a shield wire 82*c*, a terminal wire 71*a*4, a terminal wire 71*b*4, a terminal wire 71*b*5, and a shield wire 83*c*.

In the first capacitance element 71 in the first example, the first terminal 71*a* includes the terminal wires 71*a*1, 71*a*2, 71*a*3, and 71*a*4. However, only a portion of each of these wires may belong to the first terminal 71*a*. The terminal wires 71*a*1, 71*a*2, 71*a*3, and 71*a*4 are connected through a plurality of vias. The second terminal 71*b* includes the terminal wires 71*b*1, 71*b*2, 71*b*3, 71*b*4, and 71*b*5. However, only a portion of each of these wires may belong to the second terminal 71*b*. The terminal wire 71*b*1, the terminal wire 71*b*2, the terminal wire 71*b*3, the terminal wire 71*b*4, and the terminal wire 71*b*5 are connected through a plurality of vias. The dielectric layer is a portion of an oxide insulator that constitutes the insulating layer 4 provided on the semiconductor substrate 2.

The shield wires 81*a*, 81*b*, and 81*c* are connected through a plurality of vias. The shield wires 84*b* and 84*c* are connected through a via. The shield wires 85*b* and 85*c* are connected through a via. The shield wires 82*b* and 82*c* are connected through a via. The shield wire 83*a*, 83*b*, and 83*c* are connected through a plurality of vias.

In FIG. 12, the terminal wire 71*a*4 is schematically represented by two rectangles, and a dotted line is shown above the two rectangles. The dotted line indicates that the regions denoted by the two rectangles are electrically connected to each other. It can be understood from FIG. 17 that these regions are electrically connected to each other. The same also applies to portions denoted by dotted lines in FIGS. 16, 17, and so on.

In FIG. 12, each thick arrow means that electromagnetic shielding is provided between elements at end portions of the arrow.

Figure 13:
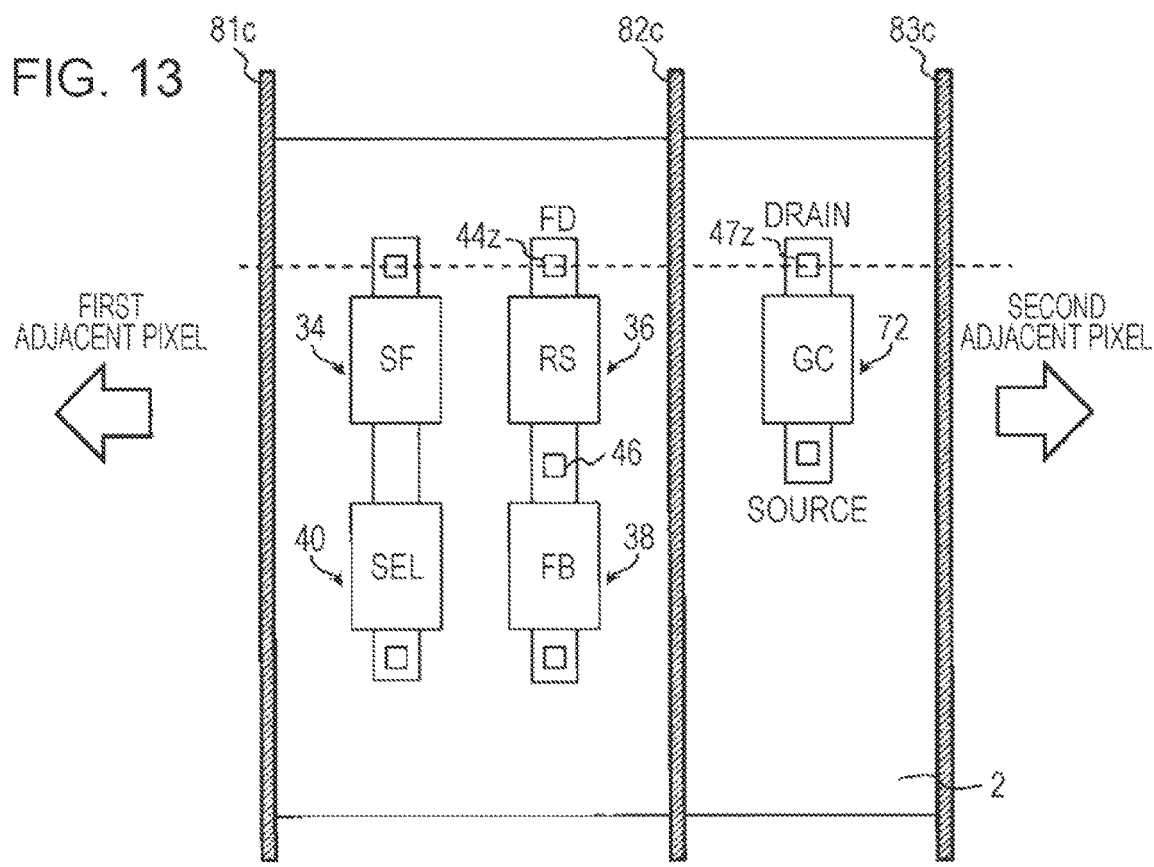
FIG. 13 is a schematic diagram illustrating the structure of the pixel according to the first example.

FIG. 13 schematically illustrates an arrangement of the amplifying transistor 34, the address transistor 40, the first reset transistor 36, the second reset transistor 38, and the sensitivity switching transistor 72, when observed in parallel to the thickness direction of the semiconductor substrate 2. The transistors 34, 40, 36, 38, and 72 are provided at the semiconductor substrate 2.

FIG. 13 also illustrates shield wires 81*c*, 82*c*, and 83*c* provided in the wire region M. The amplifying transistor 34, the address transistor 40, the first reset transistor 36, and the second reset transistor 38 are provided between the shield wire 81*c* and the shield wire 82*c*, when observed in parallel to the thickness direction of the semiconductor substrate 2. When observed in parallel to the thickness direction of the semiconductor substrate 2, the sensitivity switching transistor 72 is provided between the shield wire 82*c* and the shield wire 83*c*.

Figure 14:
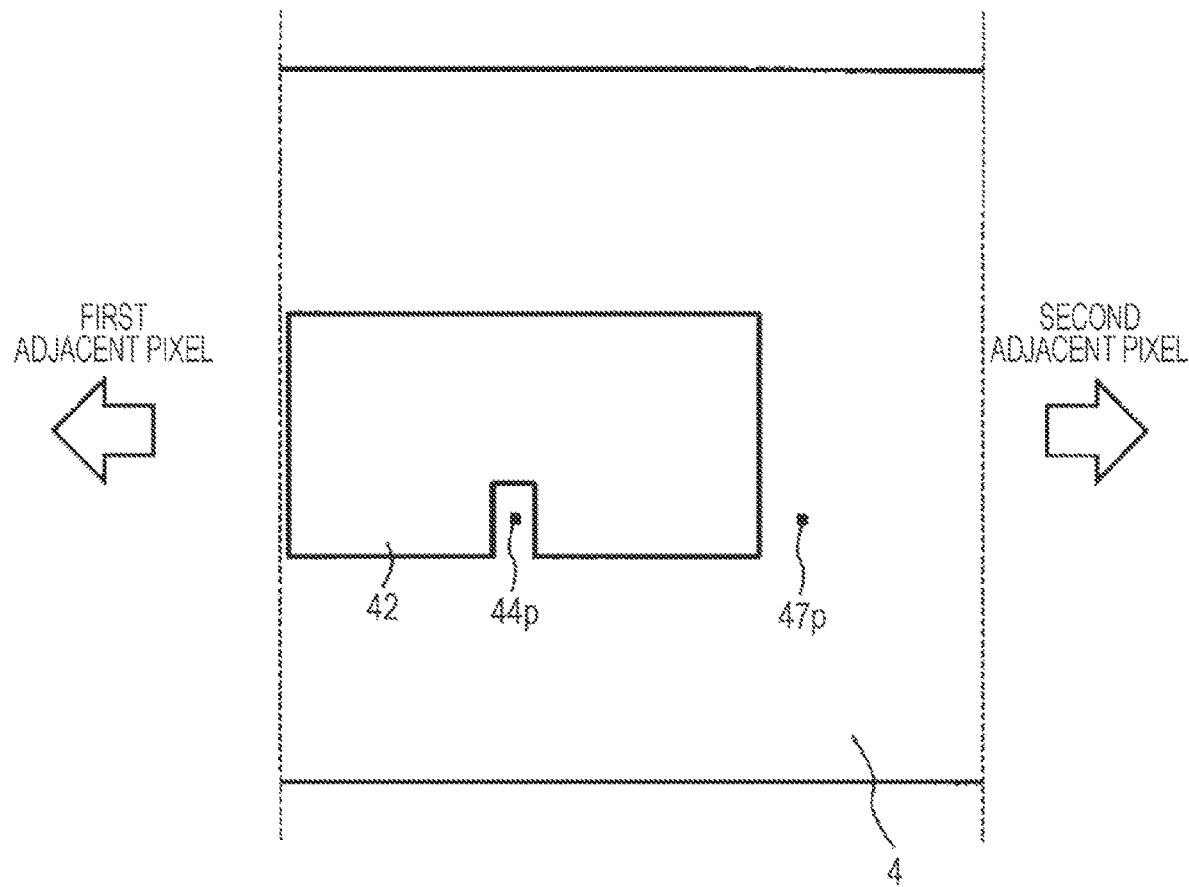
FIG. 14 is a schematic diagram illustrating the structure of the pixel according to the first example.

FIG. 14 illustrates the third capacitance element 42 when observed in parallel to the thickness direction of the semiconductor substrate 2.

Figure 15:
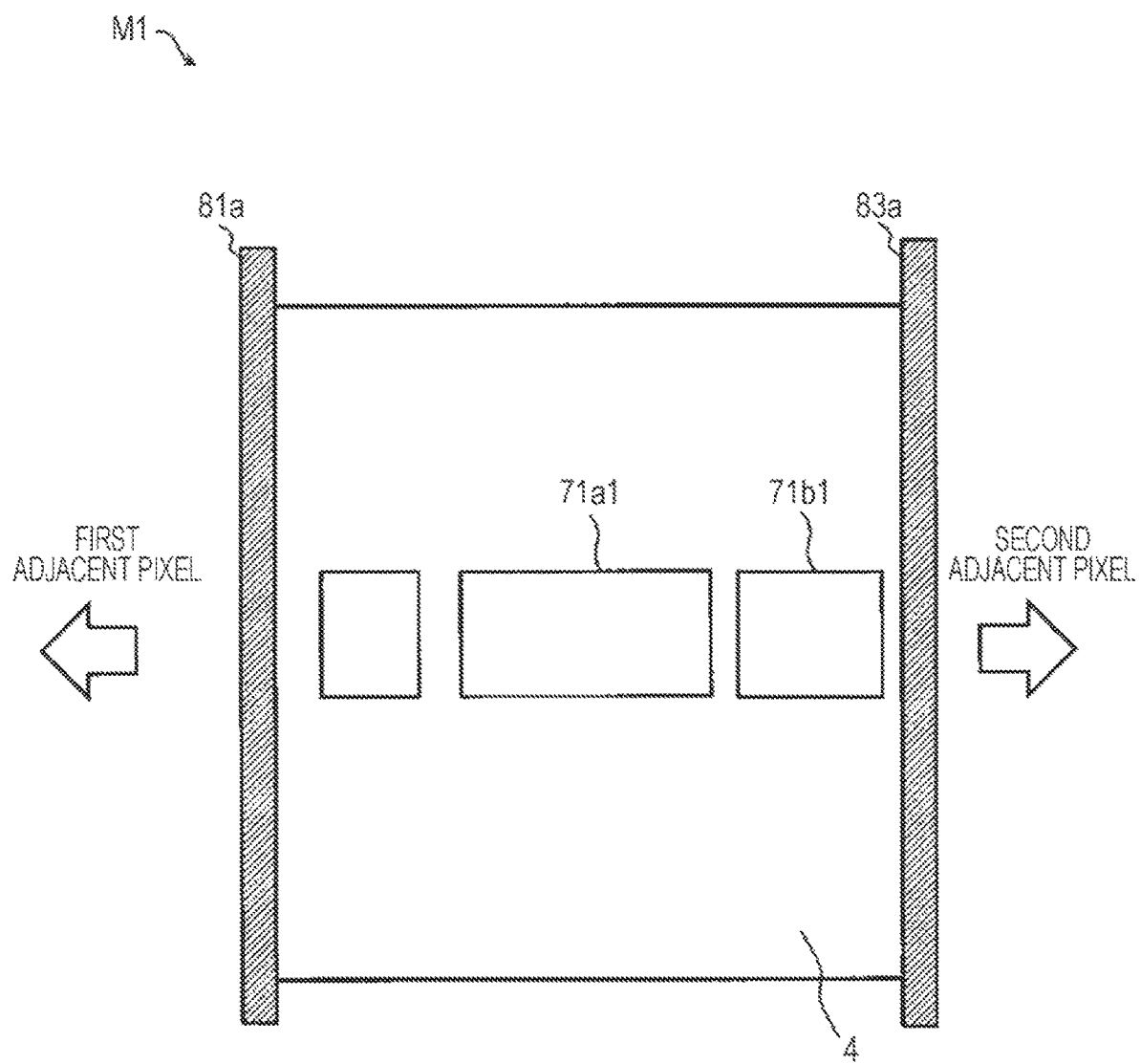
FIG. 15 is a schematic diagram illustrating the structure of the pixel according to the first example.

FIG. 15 illustrates the wiring layer M1 when observed in parallel to the thickness direction of the semiconductor substrate 2. In the wiring layer M1, the shield wire 81*a*, the terminal wire 71*a*1, the terminal wire 71*b*1, and the shield wire 83*a* are arranged in that order.

Since the shield wire 81*a* is arranged between the terminal wire 71*a*1 and the first adjacent pixel, it can suppress coupling between the terminal wire 71*a*1 and the first adjacent pixel. Since the shield wire 81*a* is arranged between the terminal wire 71*b*1 and the first adjacent pixel, it can suppress coupling between the terminal wire 71*b*1 and the first adjacent pixel. Since the shield wire 83*a* is arranged between the terminal wire 71*a*1 and the second adjacent pixel, it can suppress coupling between the terminal wire 71*a*1 and the second adjacent pixel. Since the shield wire 83*a* is arranged between the terminal wire 71*b*1 and the second adjacent pixel, it can suppress coupling between the terminal wire 71*b*1 and the second adjacent pixel.

Figure 16:
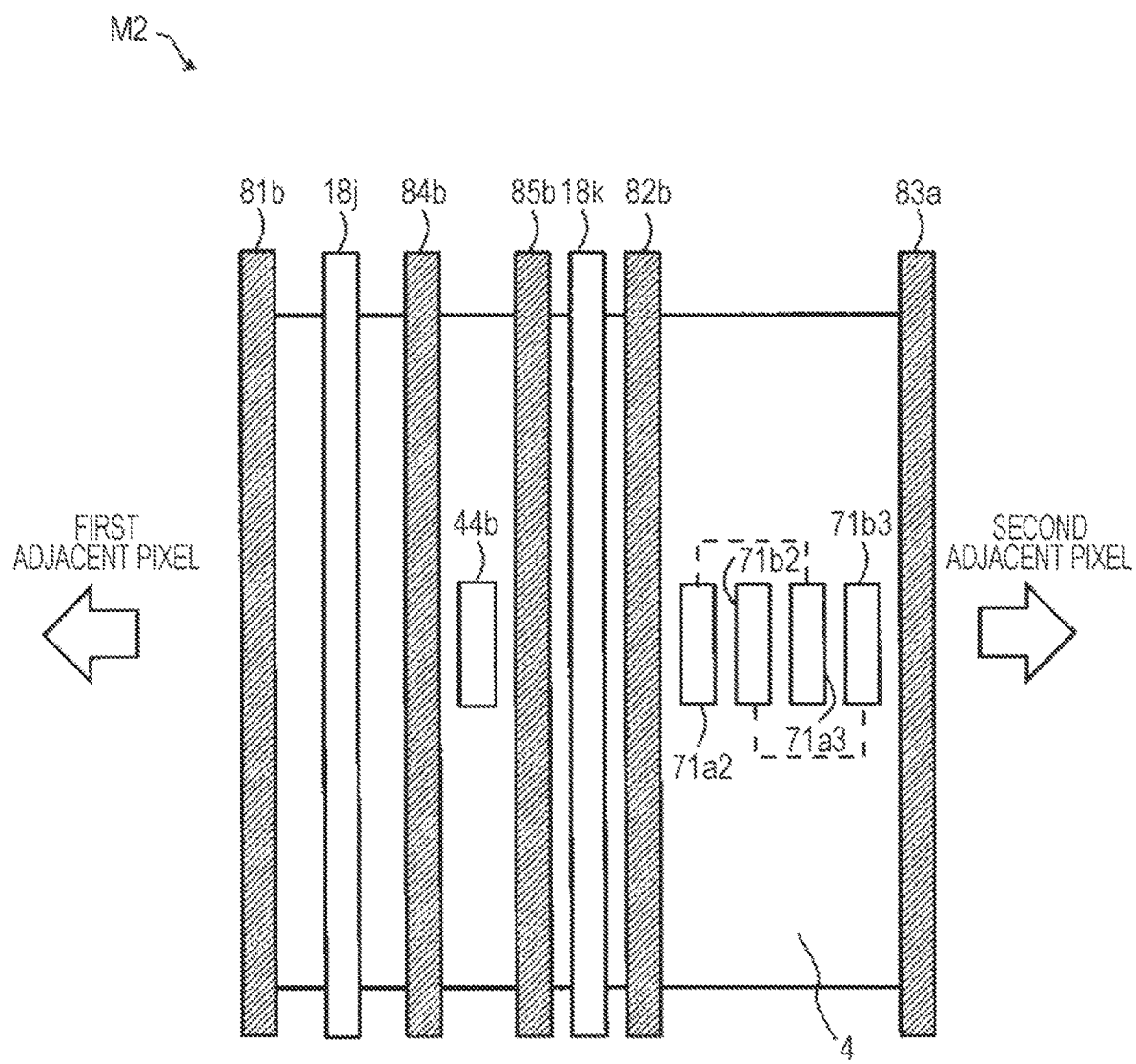
FIG. 16 is a schematic diagram illustrating the structure of the pixel according to the first example.

FIG. 16 illustrates the wiring layer M2 when observed in parallel to the thickness direction of the semiconductor substrate in the wiring layer M2, the shield wire 81*b*, the vertical signal line 18*j*, the shield wire 84*b*, the FD wire 44*b*, the shield wire 85*b*, the vertical signal line 18*k*, the shield wire 82*b*, the terminal wire 71*a*2, the terminal wire 71*b*2, the terminal wire 71*a*3, the terminal wire 71*b*3, and the shield wire 83*b* are arranged in that order.

Since the shield wire 84*b* is provided between the vertical signal line 18*j* and the FD wire 44*b*, it can suppress coupling between the vertical signal line 18*j* and the FD wire 44*b*. Since the shield wire 85*b* is provided between the vertical signal line 18*k* and the FD wire 44*b*, it can suppress coupling between the vertical signal line 18*k* and the FD wire 44*b*.

Since the shield wire 82*b* is provided between the vertical signal line 18*k* and the terminal wire 71*a*2, it can suppress coupling between the vertical signal line 18*k* and the terminal wire 71*a*2. Since the shield wire 82*b* is provided between the vertical signal line 18*k* and the terminal wire 71*b*2, it can suppress coupling between the vertical signal line 18*k* and the terminal wire 71*b*2. Since the shield wire 82*b* is provided between the vertical signal line 18*k* and the terminal wire 71*a*3, it can suppress coupling between the vertical signal line 18*k* and the terminal wire 71*a*3. Since the shield wire 82*b* is provided between the vertical signal line 18*k* and the terminal wire 71*b*3, it can suppress coupling between the vertical signal line 18*k* and the terminal wire 71*b*3.

The shield wire 82*b* can also suppress coupling between the wiring layer M1 and the wiring layer M2. Specifically, as can be understood from FIG. 12, since the shield wire 82*b* is provided between the vertical signal line 18*k* and the terminal wire 71*b*1, it is possible to suppress coupling between the vertical signal line 18*k* and the terminal wire 71*b*1.

Figure 17:
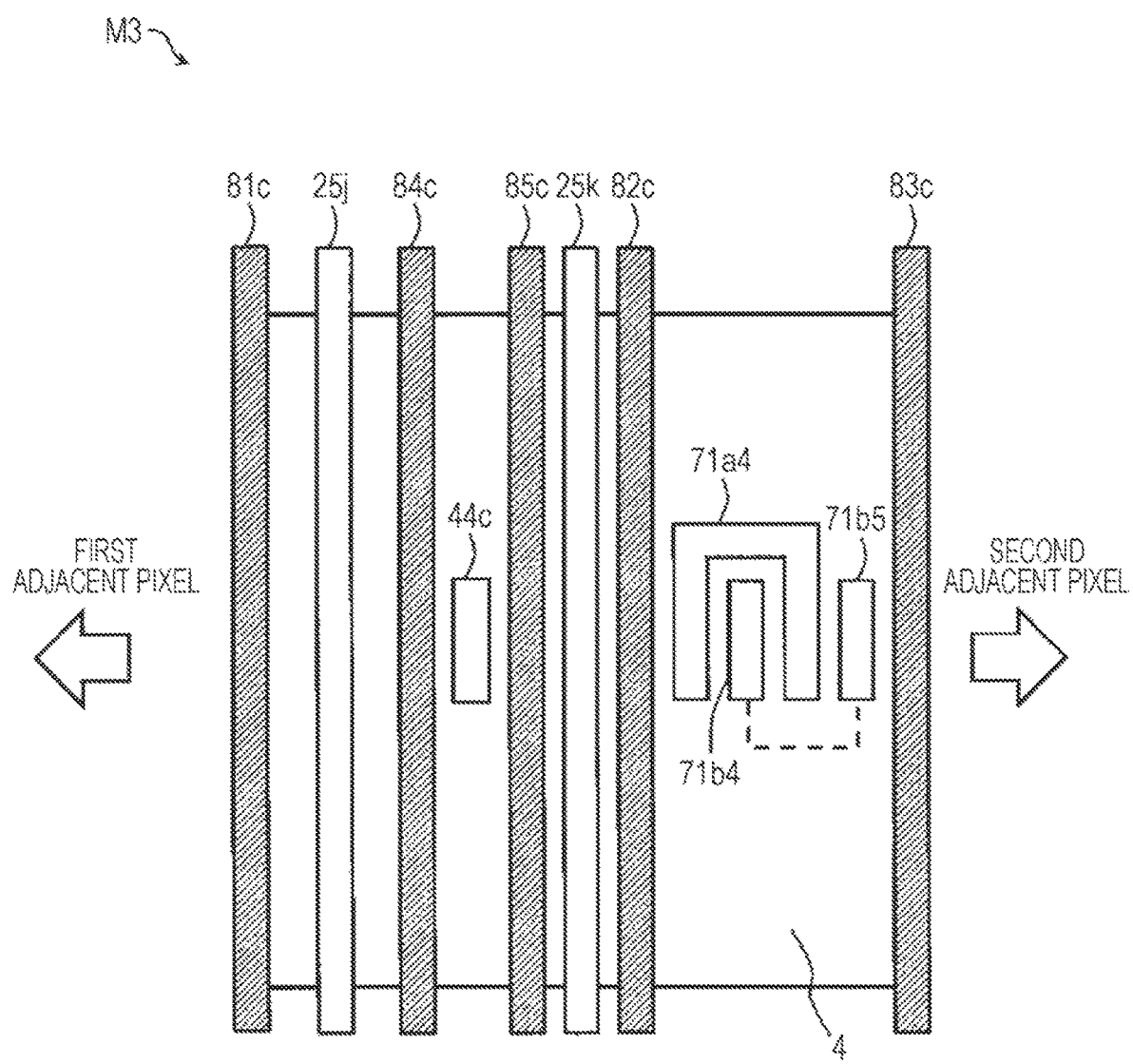
FIG. 17 is a schematic diagram illustrating the structure of the pixel according to the first example.

The shield wire 81*b* is arranged between the FD wire 44*b*, the terminal wire 71*a*2, the terminal wire 71*b*2, the terminal wire 71*a*3, and the terminal wire 71*b*3 and the first adjacent pixel. Thus, the shield wire 81*b* can suppress coupling between the wires 44*b*, 71*a*2, 71*b*2, 71*a*3, and 71*b*3 and the first adjacent pixel. The shield wire 83*b* is arranged between the FD wire 44*b*, the terminal wire 71*a*2, the terminal wire 71*b*2, the terminal wire 71*a*3, and the terminal wire 71*b*3 and the second adjacent pixel. Thus, the shield wire 83*b* can suppress coupling between the wires 44*b*, 71*a*2, 71*b*2, 71*a*3, and 71*b*3 and the second adjacent pixel, FIG. 17 illustrates the wiring layer M3 when observed in parallel to the thickness direction of the semiconductor substrate 2. In the wiring layer M3, the shield wire 81*c*, the feedback line 25*j*, the shield wire 84*c*, the FD wire 44*c*, the shield wire 85*c*, the feedback line 25*k*, the shield wire 82*c*, the terminal wire 71*a*4, the terminal wire 71*b*4, the terminal wire 71*b*5, and the shield wire 83*c* are arranged in that order.

Since the shield wire 84*c* is provided between the feedback line 25*j* and the FD wire 44*c*, it can suppress coupling between the feedback line 25*j* and the FD wire 44*c*, Since the shield wire 85*c* is provided between the feedback line 25*k* and the FD wire 44*c*, it can suppress coupling between the feedback line 25*k* and the FD wire 44*c*.

Since the shield wire 82*c* is provided between the feedback line 25*k* and the terminal wire 71*a*4, it can suppress coupling between the feedback line 25*k* and the terminal wire 71*a*4. Since the shield wire 82*c* is provided between the feedback line 25*k* and the terminal wire 71*b*4, it can suppress coupling between the feedback line 25*k* and the terminal wire 71*b*4. Since the shield wire 82*c* is provided between the feedback line 25*k* and the terminal wire 71*b*5, it can suppress coupling between the feedback line 25*k* and the terminal wire 71*b*5.

The shield wire 81*c* is arranged between the FD wire 44*c*, the terminal wire 71*a*4, the terminal wire 71*b*4, and the terminal wire 71*b*5 and the first adjacent pixel. Thus, the shield wire 81*c* can suppress coupling between the wires 44*c*, 71*a*4, 71*b*4, and 71*b*5 and the first adjacent pixel. The shield wire 83*c* is arranged between the FD wire 44*c*, the terminal wire 71*a*4, the terminal wire 71*b*4, and the terminal wire 71*b*5 and the second adjacent pixel. Thus, the shield wire 83*c* can suppress coupling between the wires 44*c*, 71*a*4, 71*b*4, and 71*b*5 and the second adjacent pixel.

As illustrated in FIG. 12, the FD wire 44*c* is connected to the pixel electrode 15*c* through an FD via 44*v*. As can be understood from FIGS. 12 and 13, one of the source and the drain of the first reset transistor 36 constitutes the first diffusion region 44*z*. The first diffusion region 44*z* and the first capacitance element 71 (specifically, the first terminal 71*a*) are connected through a via 44*p*. The first diffusion region 44*z*, the via 44*p*, the terminal wire 71*a*1, the FD wire 44*b*, the terminal wire 71*a*2, the terminal wire 71*a*3, the FD wire 44*c*, the terminal wire 71*a*4, the FD via 44*v*, and the pixel electrode 15*c* are electrically connected. The via 44*p*, the FD wire 44*b*, the FD wire 44*c*, the FD via 44*v*, and so on are included in the charge accumulation node 44. Also, the first diffusion region 44*z*, the via 44*p*, the terminal wire 71*a*1, the FD wire 44*b*, the terminal wire 71*a*2, the terminal wire 71*a*3, the ED wire 44*c*, the terminal wire 71*a*4, the ED via 44*v*, and the pixel electrode 15*c* are included in the charge accumulation portion.

In this case, the charge accumulation portion refers to an entire structure in which signal charge generated by the photoelectric converting portion is accumulated. Examples of elements included in the charge accumulation portion include the charge accumulation node 44, the pixel electrode 15*c* of the photoelectric converting portion 15, the first diffusion region 44*z*, the gate of the amplifying transistor 34, the first terminal 71*a* of the first capacitance element 71, and one electrode of the second capacitance element 41.

Also, the node 47 between the first capacitance element 71 and the sensitivity switching transistor 72 and an electrical connection portion of the node 47 is defined as an electrical portion TC. The electrical portion TC is provided so that the dielectric layer of the first capacitance element 71 is interposed between the electrical portion TC and the charge accumulation portion. The electrical portion TC is also controlled to be put into a floating state and a non-floating state.

As can be understood from FIGS. 12 and 13, one of the source and the drain of the sensitivity switching transistor 72 constitutes a second diffusion region 47*z*. In the illustrated example, the drain of the sensitivity switching transistor 72 constitutes the second diffusion region 47*z*. The second diffusion region 47*z* is electrically connected to the second terminal 71*b*. Specifically, the second diffusion region 47*z* and the second terminal 71*b* (specifically, the terminal wire 71*b*1) are connected through a via 47*p*. That is, the second diffusion region 47*z*, the via 47*p*, the terminal wire 71*b*1 the terminal wire 71*b*2, the terminal wire 71*b*3, the terminal wire 71*b*4, and the terminal wire 71*b*5 are electrically connected. The via 47*p* is included in the node 47. In the illustrated example, specifically, the via 47*p* corresponds to the node 47. The second diffusion region 47*z*, the via 47*p*, and the second terminal 71*b* are included in the electrical portion TC. That is, the second diffusion region 47*z*, the via 47*p*, the terminal wire 71*b*1, the terminal wire 71*b*2, the terminal wire 71*b*3, the terminal wire 71*b*4, and the terminal wire 71*b*5 are included in the electrical portion TC.

As can be understood from the above description, in this example, the imaging device incudes the insulating layer 4 which is an oxide insulator layer, a first wire provided in the insulating layer 4, and a second wire provided in the insulating layer 4. The first capacitance element 71 includes a dielectric layer. The first terminal 71*a* includes at least a portion of the first wire. The second terminal 71*b* includes at least a portion of the second wire. The dielectric layer includes a portion of the insulating layer 4 in which the first wire and the second wire are embedded. Such a first capacitance element 71 is advantageous from the perspective of suppressing leakage current in the first capacitance element 71. Specifically, the first capacitance element 71 in the first example has a MOM structure, as described above.

The terminal wire 71*a*1 can correspond to the above-described first wire. The terminal wire 71*a*2 can correspond to the above-described first wire. The terminal wire 71*a*3 can correspond to the above-described first wire. The terminal wire 71*a*4 can correspond to the above-described first wire.

The terminal wire 71*b*1 can correspond to the above-described second wire. The terminal wire 71*b*2 can correspond to the above-described second wire. The terminal wire 71*b*3 can correspond to the above-described second wire. The terminal wire 71*b*4 can correspond to the above-described second wire. The terminal wire 71*b*5 can correspond to the above-described second wire.

In the first capacitance element 71 in the first example, a parasitic capacitance between the charge accumulation portion and the electrical portion TC is utilized as a capacitance of the first capacitance element 71.

A structure in which the second reset transistor 38, the feedback line 25, the second capacitance element 41, and so on are omitted from the structure in the first example can be employed as the structure of the pixel in the first embodiment. This point also applies to second to fourth examples described below.

Some other examples of the structure of the pixel will be described below. Hereinafter, elements that are common to those in the example described above and those in the examples described below are denoted by the same reference numerals, and descriptions thereof may be omitted. Descriptions of the individual examples can be applied to each other, as long as they are not technically contradictory. The examples may also be combined with each other, as long as such a combination is not technically contradictory.

(Second Example of Structure of Pixel)

Figure 18:
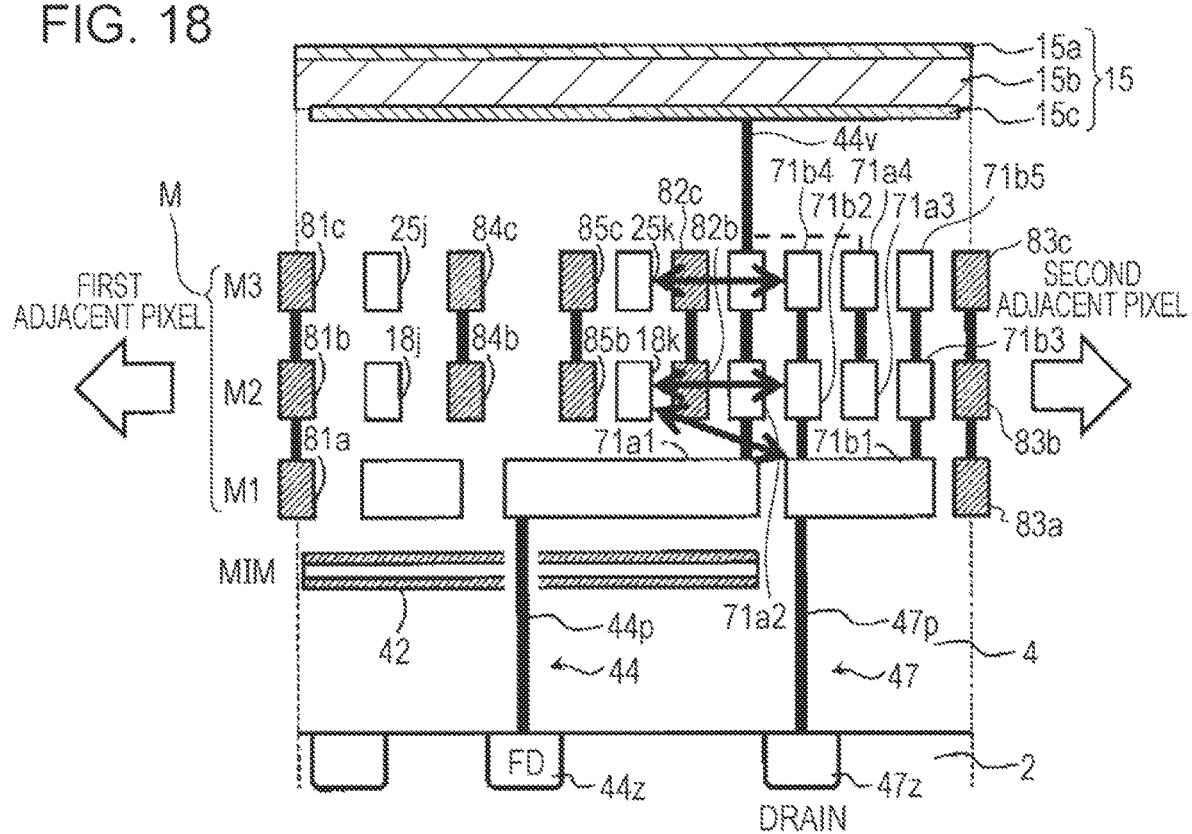
FIG. 18 is a schematic diagram illustrating the structure of a pixel according to a second example.

FIG. 18 schematically illustrates a second example of the structure of a pixel that can be applied to the second and third embodiments.

The pixel in the second example illustrated in FIG. 18 does not include the FD wires 44*b* and 44*c*. The FD via 44*v* provides connection between the terminal wire 71*a*4 and the pixel electrode 15*c*. With such an arrangement, it is possible to realize the first capacitance element 71 that makes more positive use of the parasitic capacitance between the charge accumulation portion and the electrical portion TC than in the first example. Making positive use of the parasitic capacitance can increase the capacitance value of the first capacitance element 71 and can increase the range in which the sensitivity can be adjusted.

(Third Example of Structure of Pixel)

FIGS. 19 to 24 schematically illustrate a third example of the structure of a pixel that can be applied to the second and third embodiments.

The third example and the first and second examples differ from each other in the first capacitance element 71. Specifically, the first capacitance element 71 in the third example has a MIM structure.

Figure 19:
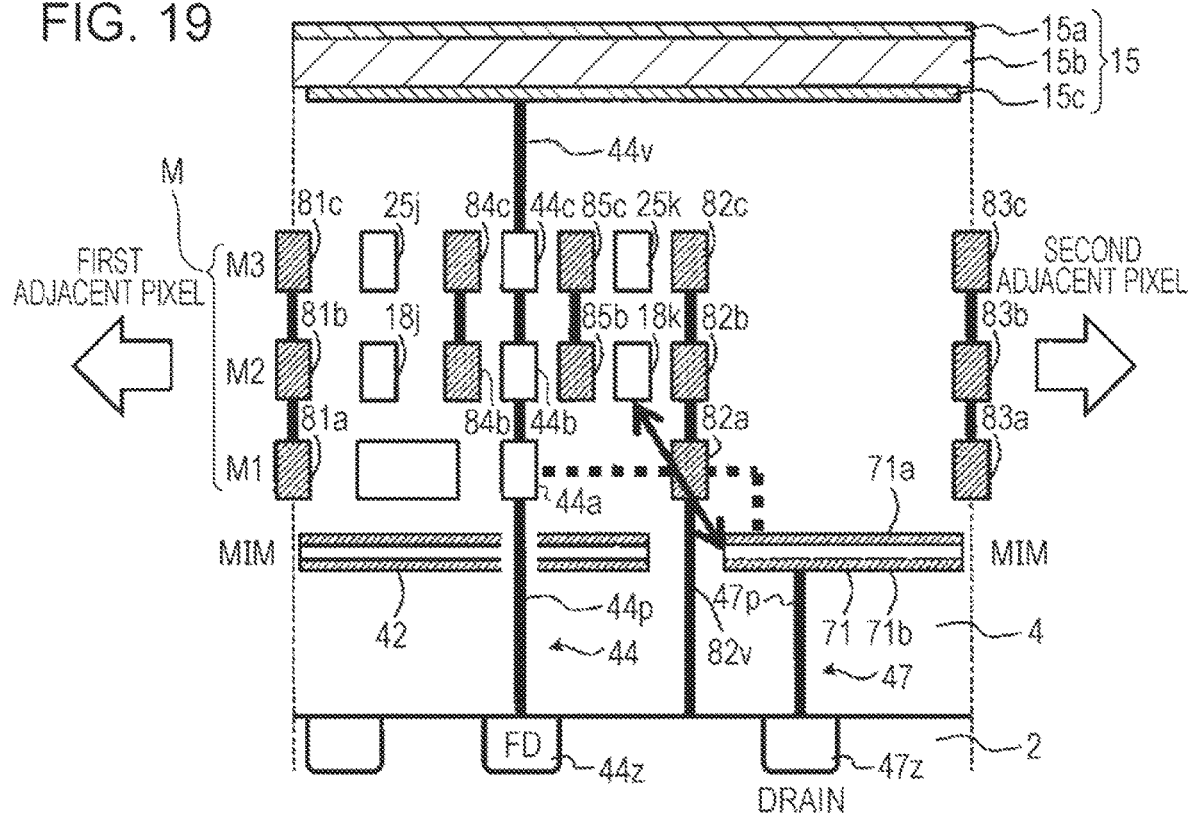
FIG. 19 is a schematic diagram illustrating the structure of a pixel according to a third example.

FIG. 19 schematically illustrates a section of the pixel in the third example, the section being parallel to the thickness direction of the semiconductor substrate 2. As illustrated in FIG. 19, the pixel in the third example does not have the terminal wires 71*a*1, 71*a*2, 71*a*3, and 71*a*4, the second terminal 71*b*, and the terminal wires 71*b*1, 71*b*2, 71*b*3, 71*b*4, and 71*b*5. The pixel in the third example includes an FD wire 44a and a shield wire 82a. In the pixel in the third example, the first capacitance element 71 is provided between the wire region M and the semiconductor substrate 2. The pixel in the third example includes a series of vias 82v.

The shield wires 82a, 82b, and 82c are connected through a plurality of vias. The shield wire 82a is connected to the series of vias 82v. The series of vias 82v extends from the shield wire 82a toward the semiconductor substrate 2 via a region between the third capacitance element 42 and the first capacitance element 71. In the illustrated example, the series of vias 82v reaches the semiconductor substrate 2.

The wiring layer M1 includes the shield wire 81a, the ED wire 44a, and the shield wires 82a and 83a.

In FIG. 19, a dotted line is depicted between the first terminal 71a of the first capacitance element 71 and the FD wire 44a. This dotted line indicates that the first terminal 71a and the ED wire 44a are electrically connected to each other.

Specifically, in the first capacitance element 71 in the third example, the first terminal 71a and the second terminal 71b are electrodes. The electrode that constitutes the first terminal 71a is electrically connected to the FD wire 44a. Also, the first capacitance element 71 in the third example is provided in the insulating layer 4, and the dielectric layer of the first capacitance element 71 and the insulating layer 4 are layers that are different from each other.

Figure 20:
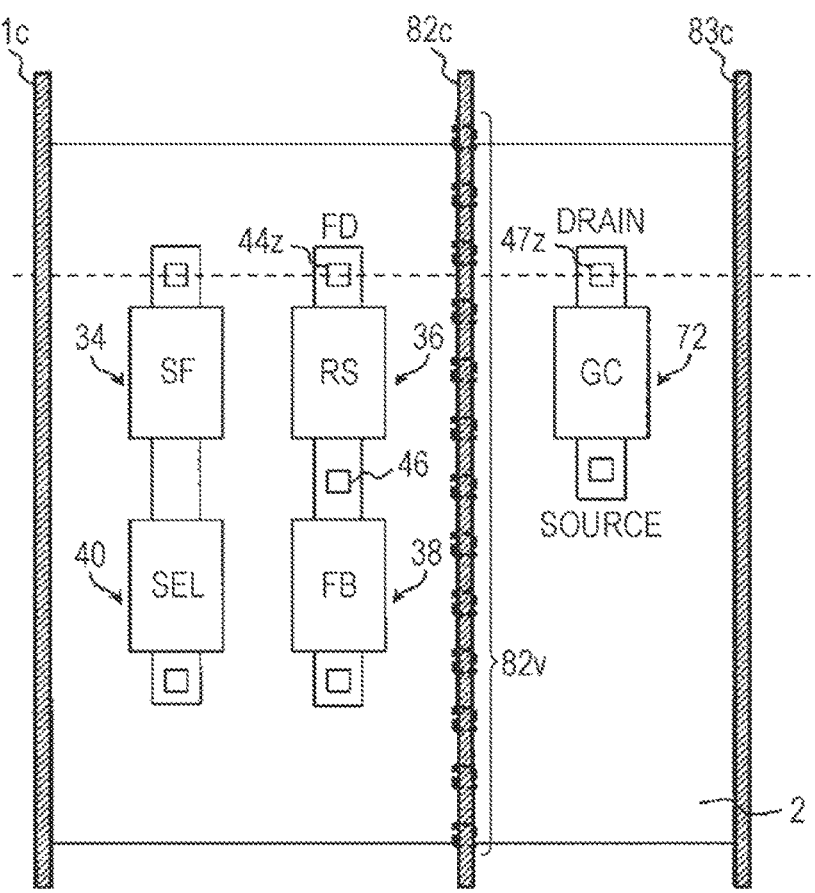
FIG. 20 is a schematic diagram illustrating the structure of the pixel according to the third example.

FIG. 20 schematically illustrates an arrangement of the amplifying transistor 34, the address transistor 40, the first reset transistor 36, the second reset transistor 38, and the sensitivity switching transistor 72, when observed in parallel to the thickness direction of the semiconductor substrate 2. FIG. 20 also illustrates the shield wires 81c, 82c, and 83c provided in the wire region M. FIG. 20 also illustrates the series of vias 82v.

Figure 21:
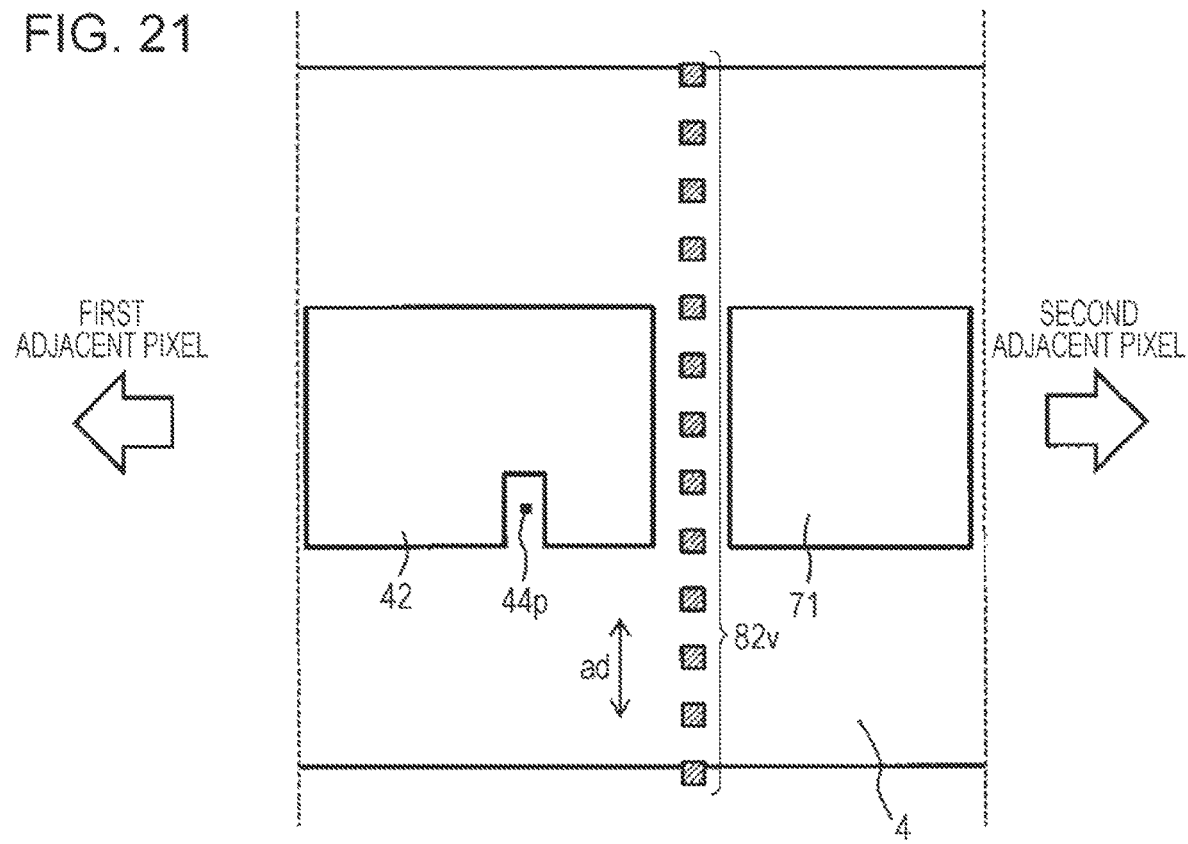
FIG. 21 is a schematic diagram illustrating the structure of the pixel according to the third example.

FIG. 21 illustrates the third capacitance element 42 and the first capacitance element 71 when observed in parallel to the thickness direction of the semiconductor substrate 2. The series of vias 82v is arranged between the third capacitance element 42 and the first capacitance element 71. The spacing between the vias in the series of vias 82v is, for example, larger than or equal to 0.01 μm and is smaller than or equal to 10 μm, and in one specific example, the spacing is larger than or equal to 0.02 μm and is smaller than or equal to 2 μm. In the illustrated example, when observed in parallel to the thickness direction of the semiconductor substrate 2, the series of vias 82v is distributed in a larger range than the dimension of the third capacitance element 42 and the first capacitance element 71 with respect to an arrangement direction ad.

Figure 22:
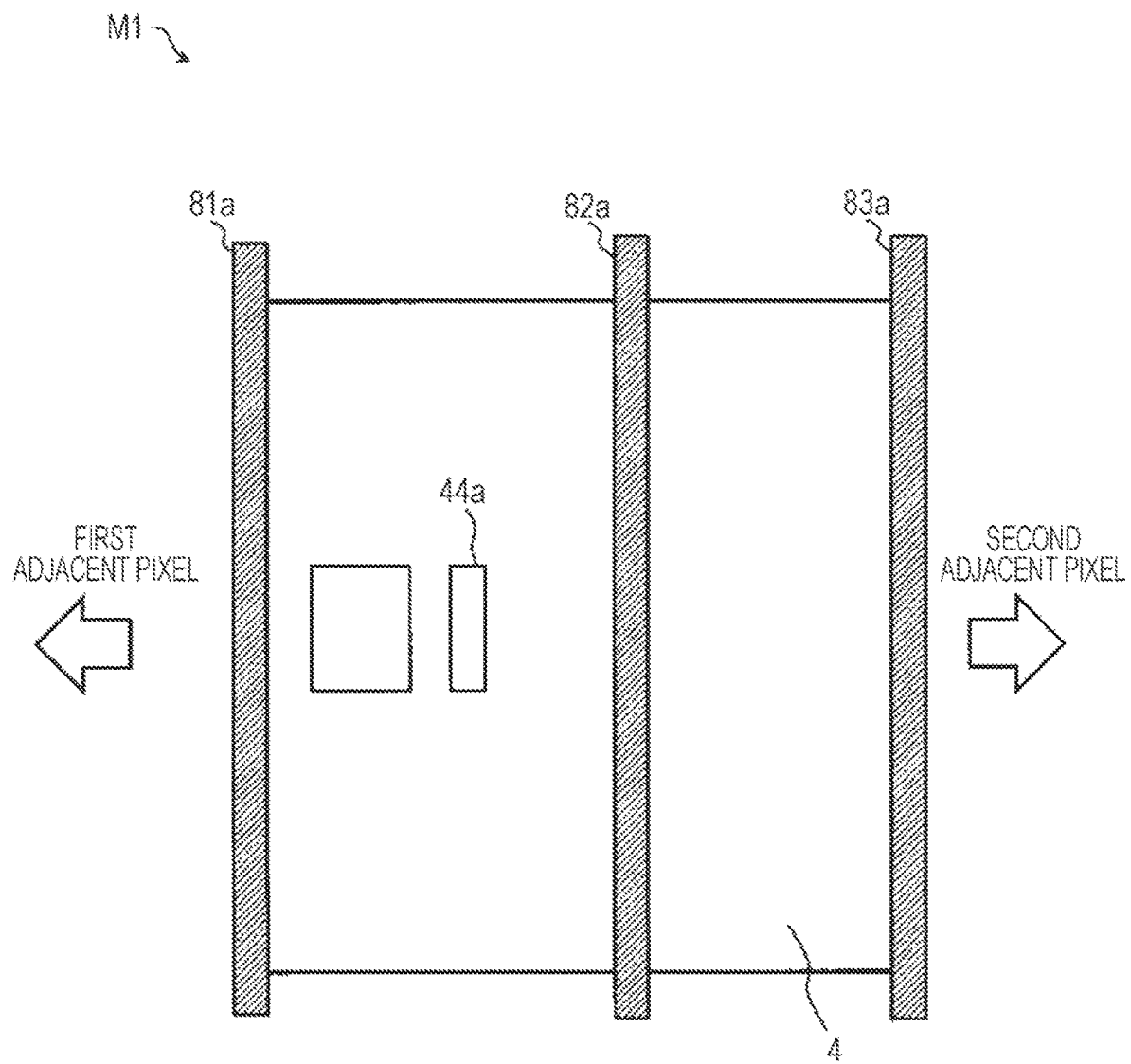
FIG. 22 is a schematic diagram illustrating the structure of the pixel according to the third example.
Figure 23:
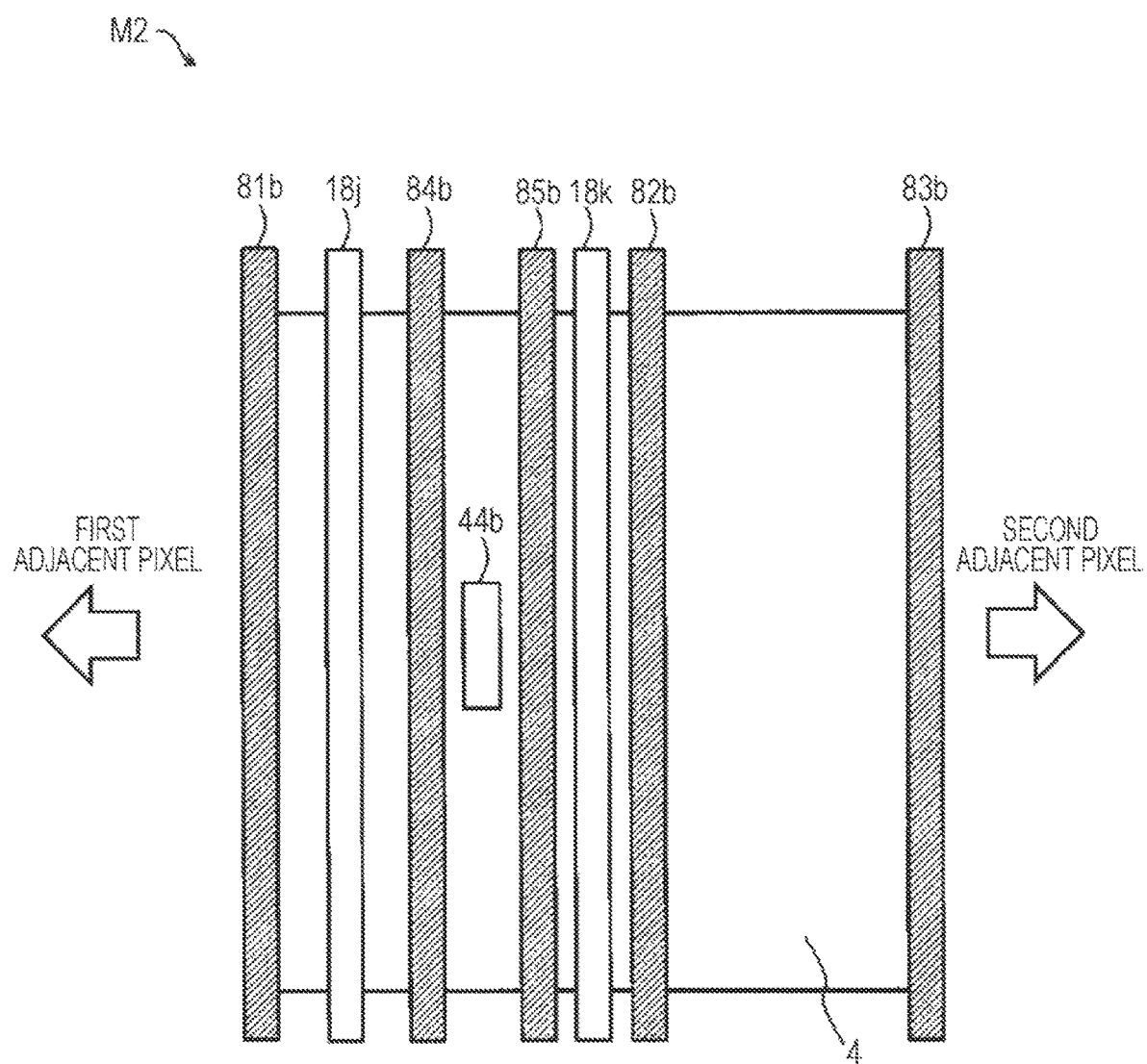
FIG. 23 is a schematic diagram illustrating the structure of the pixel according to the third example.
Figure 24:
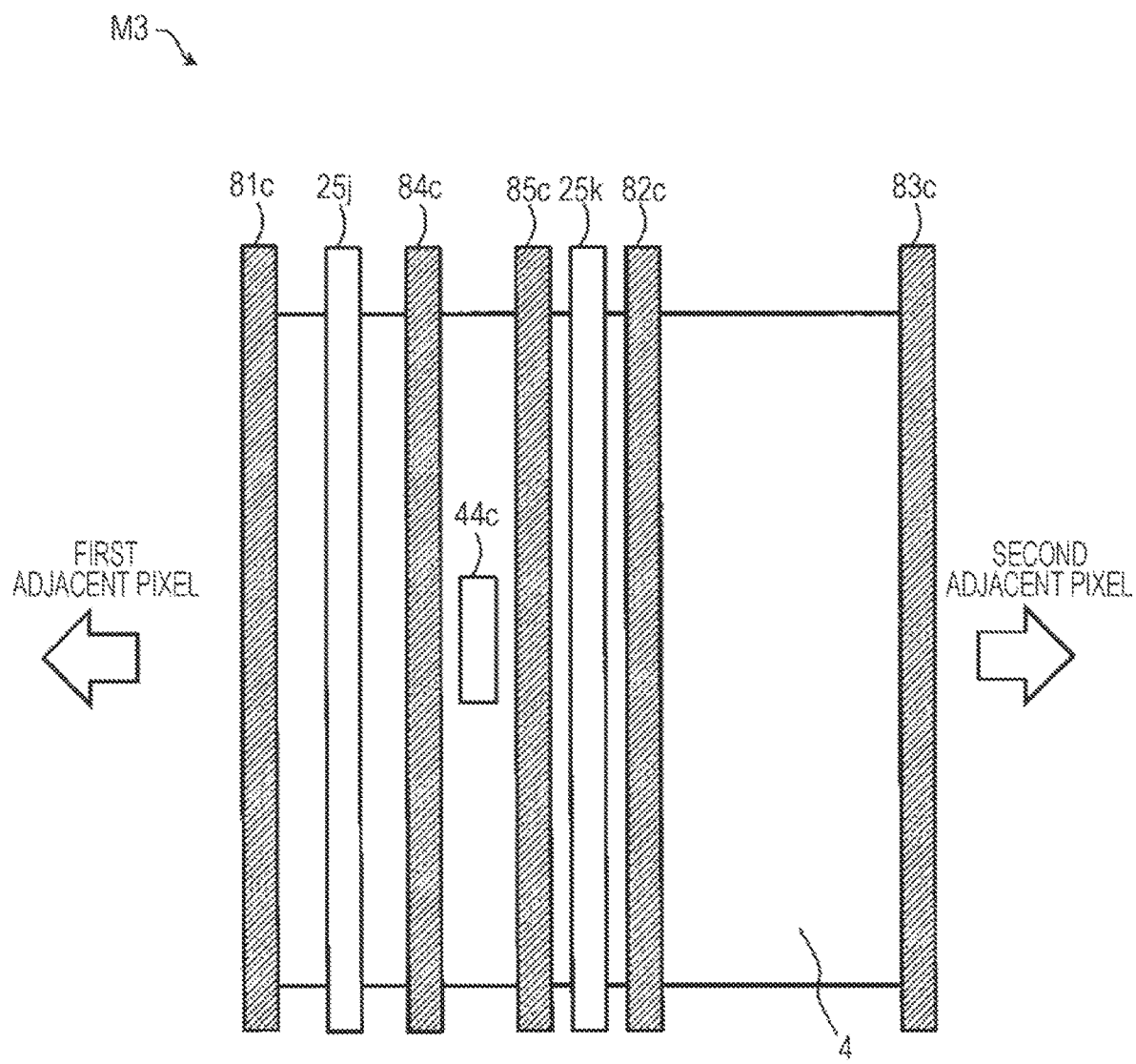
FIG. 24 is a schematic diagram illustrating the structure of the pixel according to the third example.

FIG. 22 illustrates the wiring layer M1 when observed in parallel to the thickness direction of the semiconductor substrate 2. In the wiring layer M1, the shield wire 81a, the FD wire 44a, the shield wire 82a, and the shield wire 83a are arranged in that order.

In the third example, since the series of vias 82v is arranged between the third capacitance element 42 and the first capacitance element 71, it can suppress coupling between the third capacitance element 42 and the first capacitance element 71. Since the series of vias 82v is arranged between the vertical signal line 18k and the first capacitance element 71, it can suppress coupling between the vertical signal line 18k and the first capacitance element 71.

In the third example, since the shield wire 82a is arranged between the vertical signal line 18k and the first capacitance element 71, it can suppress coupling between the vertical signal line 18k and the first capacitance element 71.

As can be understood from the above description, in this example, the imaging device includes the insulating layer 4. The first capacitance element 71 is provided in the insulating layer 4. The first terminal 71a is a first electrode. The second terminal 71b is a second electrode. The dielectric layer and the insulating layer 4 differ from each other in composition. Such a first capacitance element 71 is advantageous from the perspective of suppressing leakage current in the first capacitance element 71.

(Fourth Example of Structure of Pixel)

Figure 25:
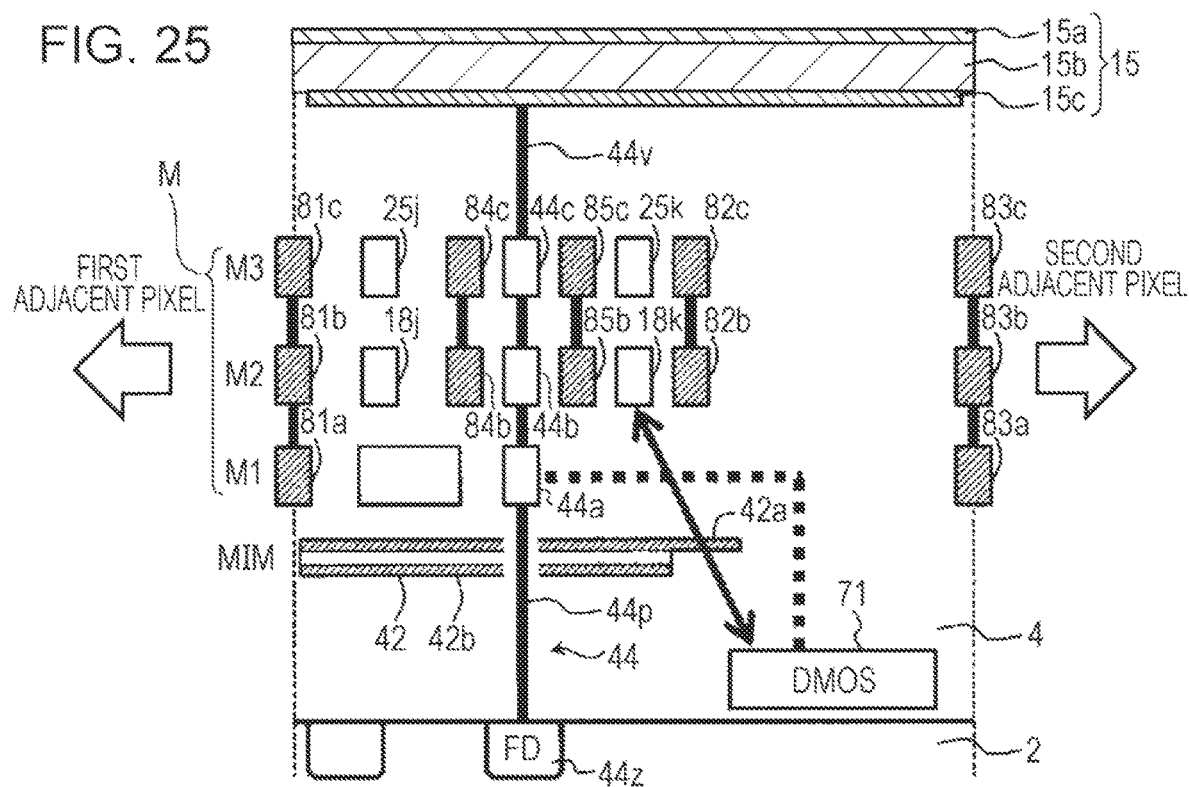
FIG. 25 is a schematic diagram illustrating the structure of a pixel according to a fourth example.
Figure 26:
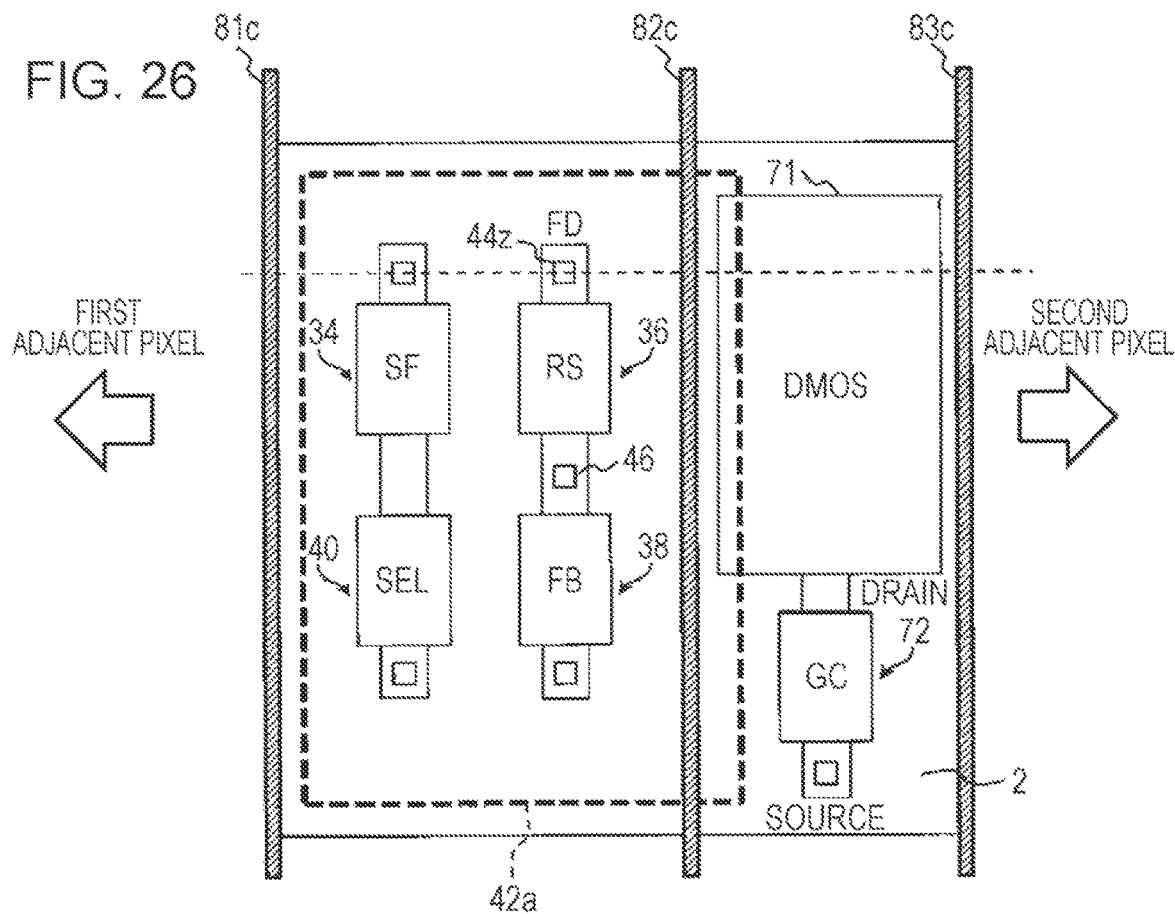
FIG. 26 is a schematic diagram illustrating the structure of the pixel according to the fourth example.

FIGS. 25 and 26 schematically illustrate a fourth example of the structure of a pixel that can be applied to the second and third embodiments.

The fourth example and the third example differ from each other in the first capacitance element 71. In the fourth example, the first pixel has a second transistor including a second source, a second drain, and a second gate. The first terminal 71a is the second gate. The second terminal 71b is one of the second source and the second drain. Using the second gate as the first terminal 71a is advantageous from the perspective of suppressing leakage current in the first capacitance element 71, compared with a case in which the second source or the second drain is used as the first terminal 71a. Specifically, using the second gate electrically insulated from the semiconductor substrate 2 as the first terminal 71a can suppress an influence of leakage current in the semiconductor substrate 2, the leakage current being generated in the regions of the second source and the second drain. As can be understood from the above description, in the fourth example, the second transistor and the first capacitance element 71 are not completely independent from each other, and the second transistor and the first capacitance element 71 share some elements. With such an arrangement, the first capacitance element 71 can be constituted using the second transistor.

The first capacitance element 71 in the fourth example is, for example, a MOS transistor, and in one specific example, the first capacitance element 71 is a DMOS (a depletion type MOS) transistor.

The third capacitance element 42 is also different between the fourth example and the third example. Specifically, in the fourth example, one electrode 42a of the third capacitance element 42 extends to a position close to the first capacitance element 71, compared with the third example. In the illustrated example, one electrode 42a of the third capacitance element 42 faces the wire region M, and another electrode 42b of the third capacitance element 42 faces the semiconductor substrate 2.

The description below will be given of a shield structure configured in the first to fourth examples.

In the shield structure, the above-described shield wires are utilized as electromagnetic shields. Specifically, the shield wires 81a, 81b, 81c, 82a, 82b, 82c, 83a, 83b, 83c, 84b, 84c, 85b, and 85c can be utilized as electromagnetic shields. These wires can each be a portion of one power-supply wire 22 illustrated in FIG. 1 or 7. One power-supply wire 22 can branch into a plurality of portions, and the plurality of portions can pass through one pixel. However, these wires may be constituted by elements that are different from the power-supply wire 22. For example, these wires may be ground lines for supplying a ground potential to the semiconductor substrate 2 or may be dedicated lines for shielding.

In the shield structure, vias, electrodes, and so on can also be utilized as electromagnetic shields. Specifically, the series of vias 82v in the third example illustrated in FIGS. 19 to 21 can also be utilized as an electromagnetic shield. Also, the electrode 42a of the third capacitance element 42 in the fourth example illustrated in FIG. 25 can also be utilized as an electromagnetic shield.

In the first to fourth examples, the imaging device includes a voltage fluctuation wire in which a voltage fluctuates and a first shield. The voltage fluctuation wire and the first shield are located in the first pixel. The distance between the voltage fluctuation wire and the first shield is smaller than the distance between the voltage fluctuation wire and the first capacitance element 71. The first shield according to this configuration is suitable for suppressing coupling between the voltage fluctuation wire and the first capacitance element 71. Even when the voltage of the voltage fluctuation wire fluctuates, the suppression of the coupling makes it difficult for the fluctuation to affect the charge accumulation portion in which the charge generated by the photoelectric converting portion 15 is present. This is advantageous from the perspective of suppressing noise mixing into a signal corresponding to the signal charge.

In the first and second examples, a combination of the vertical signal line 18k and the shield wire 82b can correspond to a combination of the voltage fluctuation wire and the first shield. A combination of the feedback line 25k and the shield wire 82c can correspond to a combination of the voltage fluctuation wire and the first shield. A combination of the feedback line 25k and the shield wire 82b can correspond to a combination of the voltage fluctuation wire and the first shield.

In the third example, a combination of the vertical signal line 18k and the shield wire 82a can correspond to a combination of the voltage fluctuation wire and the first shield. A combination of the vertical signal line 18k and the series of vias 82v can correspond to a combination of the voltage fluctuation wire and the first shield.

In the fourth example, a combination of the vertical signal line 18k and the electrode 42a can correspond to a combination of the voltage fluctuation wire and the first shield.

In the first to fourth examples, the voltage of the voltage fluctuation wire can be changed in a state in which the voltage of the first shield is fixed. Such an arrangement is advantageous from the perspective of suppressing mixing of the aforementioned noise.

In a first section that is orthogonal to the thickness direction of the semiconductor substrate 2, the first shield can be placed between the voltage fluctuation wire and the first capacitance element 71. Such an arrangement is advantageous from the perspective of suppressing mixing of the aforementioned noise. A combination of the vertical signal line 18k and the shield wire 82b in the first and second examples can correspond to a combination of the voltage fluctuation wire and the first shield. A combination of the feedback line 25k and the shield wire 82c in the first and second examples can correspond to a combination of the voltage fluctuation wire and the first shield.

In a second section that is parallel to the thickness direction of the semiconductor substrate 2, the first shield can be provided between the voltage fluctuation wire and the first capacitance element 71. Such an arrangement is advantageous from the perspective of suppressing mixing of the aforementioned noise. A combination of the vertical signal line 18k and the shield wire 82b in the first and second examples can correspond to a combination of the voltage fluctuation wire and the first shield. A combination of the feedback line 25k and the shield wire 82c in the first and second examples can correspond to a combination of the voltage fluctuation wire and the first shield. A combination of the feedback line 25k and the shield wire 82b in the first and second examples can correspond to a combination of the voltage fluctuation wire and the first shield. A combination of the vertical signal line 18k and the shield wire 82a in the third example can correspond to a combination of the voltage fluctuation wire and the first shield. A combination of the vertical signal line 18k and the series of vias 82v in the third example can correspond to a combination of the voltage fluctuation wire and the first shield. A combination of the vertical signal line 18k and the electrode 42a in the fourth example can correspond to a combination of the voltage fluctuation wire and the first shield.

Specifically, the first shield can shield at least a part of electric lines of force between the voltage fluctuation wire and the first capacitance element 71. When the first shield shields at least a part of electric lines of force between the voltage fluctuation wire and the first capacitance element 71, the first shield can be said to be provided between the voltage fluctuation wire and the first capacitance element 71. Specifically, in this case, in the first section or the second section described above, the first shield can be said to be provided between the voltage fluctuation wire and the first capacitance element 71.

A line segment that connects the voltage fluctuation wire and the first capacitance element 71 may pass through the first shield. Such an arrangement is advantageous from the perspective of suppressing mixing of the aforementioned noise.

The configuration of an imaging device according to the first to fourth examples will be described below.

In the first to fourth examples, the first pixel has the first diffusion region 44z electrically connected to the photoelectric converting portion 15 and the first terminal 71a, The first pixel has the first reset transistor 36 and the amplifying transistor 34. The first diffusion region 44z is one of the source and the drain of the first reset transistor 36. The first diffusion region 44z is electrically connected to the gate of the amplifying transistor 34.

Also, in the first to fourth examples, the photoelectric converting portion 15 includes the pixel electrode 15c, the counter electrode 15a, and the photoelectric conversion layer 15b arranged between the pixel electrode 15c and the counter electrode 15a. The pixel electrode 15c is electrically connected to the first diffusion region 44z and the first terminal 71a.

However, the imaging device may have another configuration.

Figure 27:
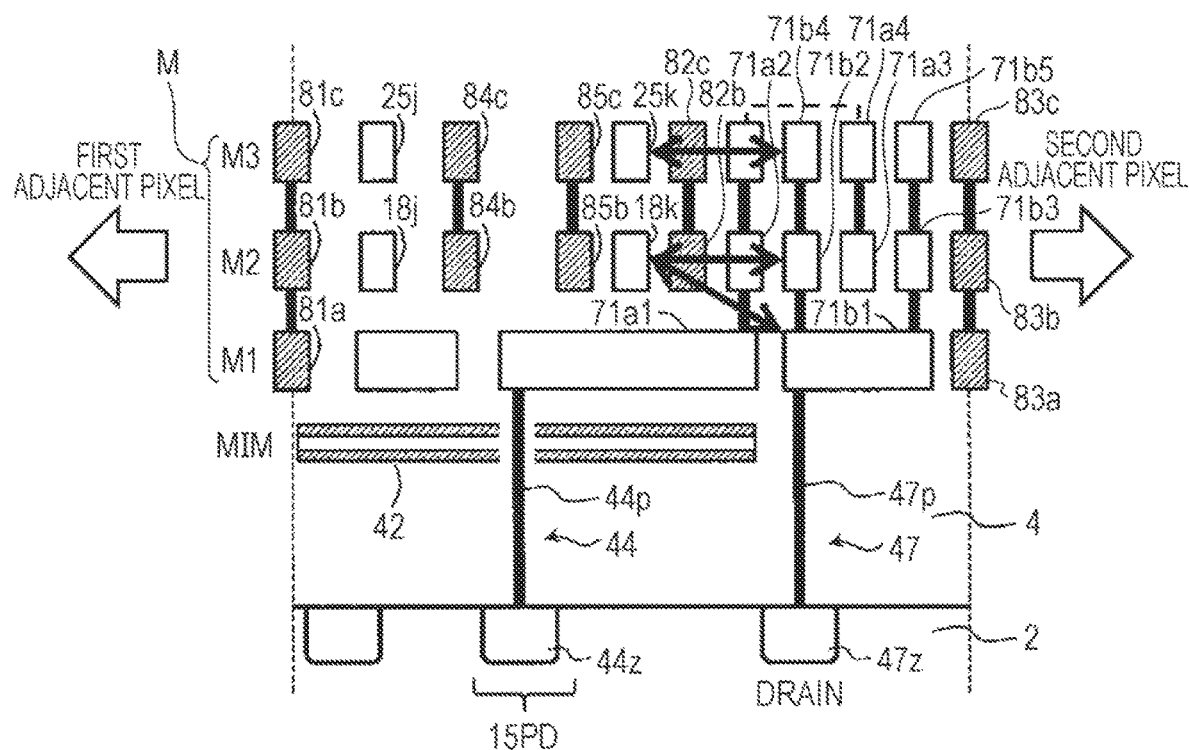
FIG. 27 is a schematic diagram illustrating the structure of a pixel using a photodiode.

For example, in the example illustrated in FIG. 27, the imaging device includes a photodiode 15PD as a photoelectric converting portion. The photodiode 15PD includes the first diffusion region 44z. The photodiode 15PD is provided in the semiconductor substrate 2.

Figure 28:
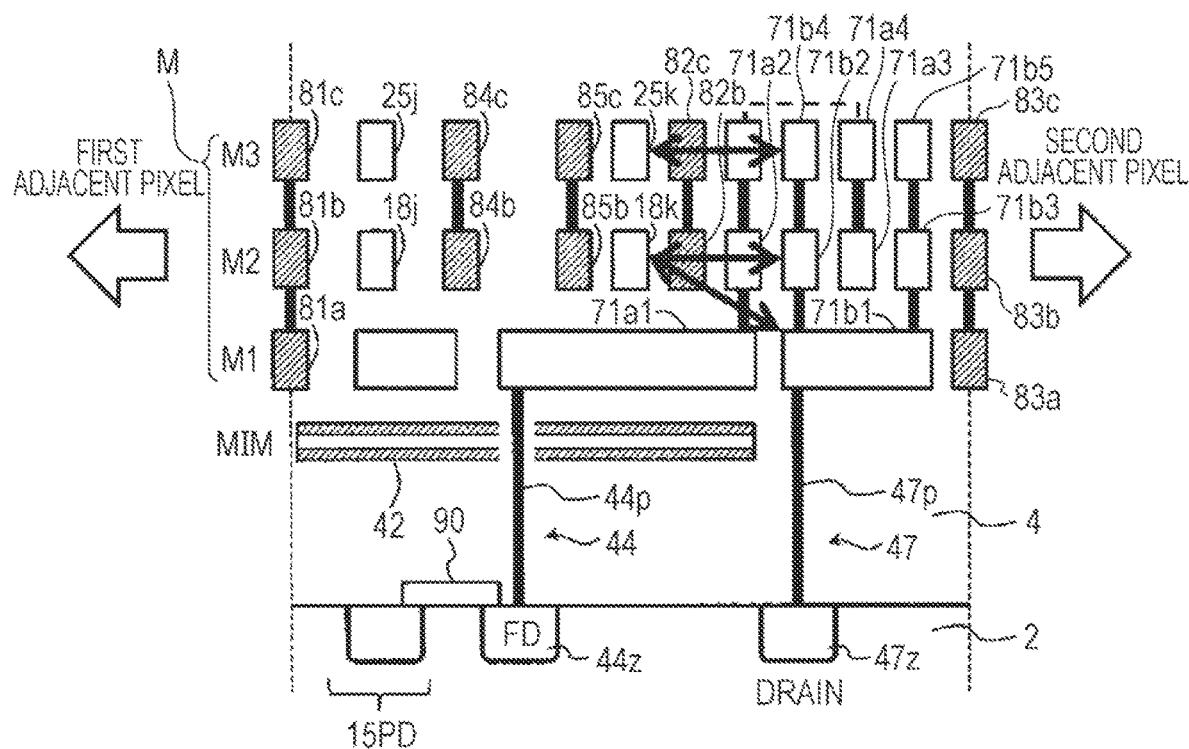
FIG. 28 is a schematic diagram illustrating the structure of the pixel using the photodiode.

Also, for example, in the example illustrated in FIG. 28, the first pixel has a transfer transistor 90. The first pixel includes a photodiode 15PD as a photoelectric converting portion. Signal charge is transferred from the photodiode 15PD to the first diffusion region 44z via the transfer transistor 90. The photodiode 15PD includes a diffusion region that is different from the first diffusion region 44z. In this example, the photodiode 15PD is also provided in the semiconductor substrate 2. That is, the different diffusion region is provided in the semiconductor substrate 2.

The examples using the photodiode 15PD illustrated in FIGS. 27 and 28 can be applied to any of the first to fourth examples.

The sensitivity switching transistor 72 may be referred to as a "first transistor 72". The first reset transistor 36 may be referred to as a "third transistor 36". The amplifying transistor 34 may be referred to as a "fourth transistor 34". The transfer transistor 90 may be referred to as a "fifth transistor 90". The second reset transistor 38 may be referred to as a "sixth transistor 38". The overflow transistor 39 may be referred to as a "seventh transistor 39".

(Camera System)

A camera system 105 according to one example will be described with reference to FIG. 29.

Figure 29:
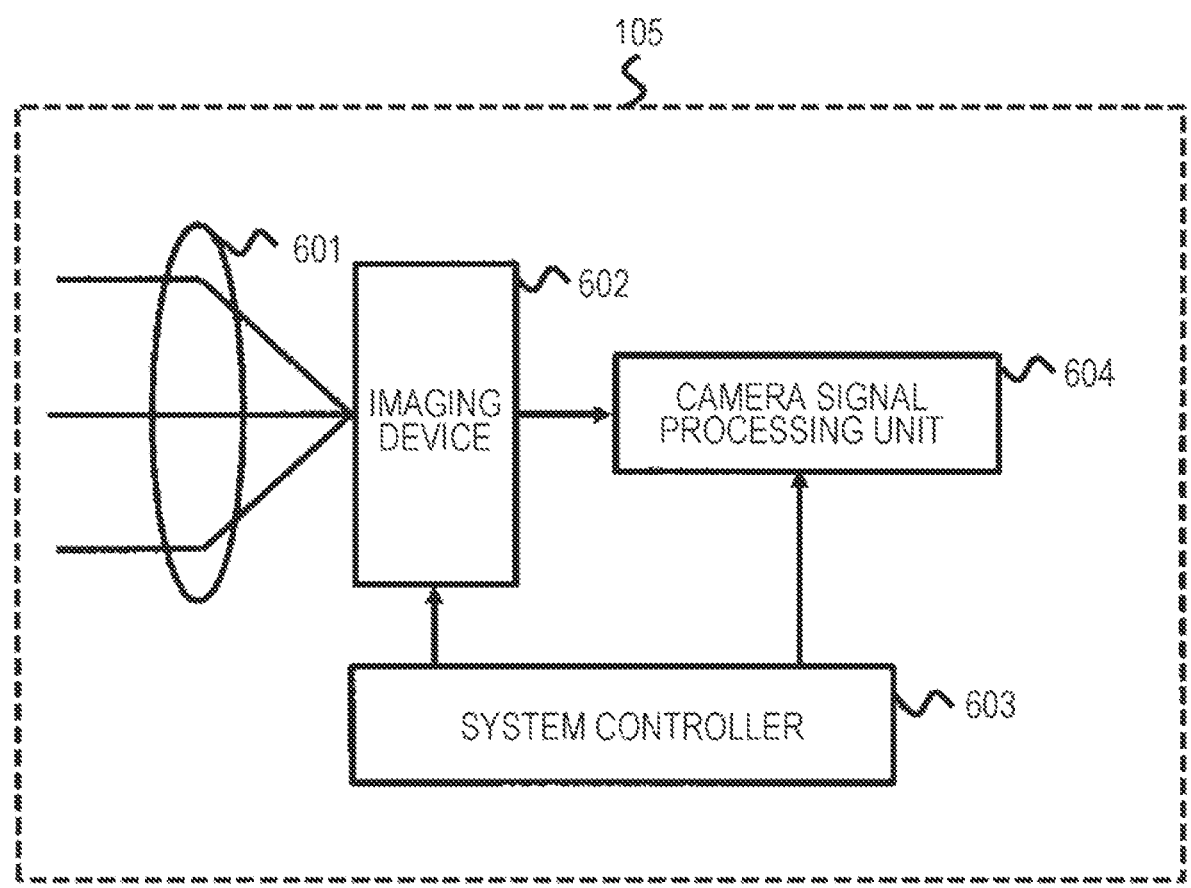
FIG. 29 is a schematic diagram illustrating a configuration example of a camera system.

FIG. 29 schematically illustrates a configuration example of the camera system 105. The camera system 105 includes a lens optical system 601, an imaging device 602, a system controller 603, and a camera signal processing unit 604.

The lens optical system 601 includes, for example, a lens for autofocusing, a lens for zooming, and a diaphragm. The lens optical system 601 focuses light onto an imaging plane of the imaging device 602. The imaging device according to any of the first to third embodiments described above can be used as the imaging device 602.

The system controller 603 controls the entire camera system 105. The system controller 603 can be realized by, for example, a microcomputer.

The camera signal processing unit 604 functions as a signal processing circuit for processing a signal output from the imaging device 602. The camera signal processing unit 604 performs processing, for example, gamma correction, color interpolation processing, spatial interpolation processing, and automatic white balancing. The camera signal processing unit 604 can be realized by, for example, a digital signal processor (DSP) or the like.

The camera system 105 can include a control circuit for turning on or off the sensitivity switching transistor 72 in accordance with a photography mode. The system controller 603 can correspond to the control circuit. When the system controller 603 is used as the control circuit, the control circuit can control the sensitivity switching transistor 72, as in a case in which the vertical scanning circuit 16 is used as the control circuit. However, the camera system 105 may include, as the control circuit, an element that is different from the system controller 603.

The imaging device according to the present disclosure is useful as various types of imaging device. The imaging device according to the present disclosure can also be applied to digital cameras, digital video cameras, camera-equipped mobile phones, medical cameras such as electronic endoscopes, vehicle-mounted cameras, cameras for robots, and so on.

What is claimed is:

1. An imaging device comprising:
a first pixel that includes
a photoelectric converting portion that converts incident light into signal charge;
a first capacitance element including a first terminal and a second terminal, the first terminal being electrically connected to the photoelectric converting portion in an exposure period; and
a first transistor including a first source and a first drain, one of the first source and the first drain being electrically connected to the second terminal, and a direct-current potential being applied to the other of the first source and the first drain,
wherein the first transistor is configured to switch a first state in which the direct-current potential is applied to the second terminal and a second state in which the second terminal is electrically floating.

2. The imaging device according to claim 1,
wherein the other of the first source and the first drain is connected to a fixed potential.

3. The imaging device according to claim 2,
wherein the fixed potential is a ground potential.

4. The imaging device according to claim 1, further comprising:
a control circuit that turns on or off the first transistor in accordance with a photography mode.

5. The imaging device according to claim 4,
wherein the photography mode includes a first mode and a second mode;
a sensitivity in the second mode is lower than a sensitivity in the first mode;
in the first mode, the signal charge is read out in a state in which the first transistor is off; and
in the second mode, the signal charge is read out in a state in which the first transistor is on.

6. The imaging device according to claim 1,
wherein the first pixel has a second transistor including a second source, a second drain, and a second gate;
the first terminal is the second gate; and
the second terminal is one of the second source and the second drain.

7. The imaging device according to claim 1, further comprising:
an insulating layer that is a layer of an oxide insulator;
a first wire provided in the insulating layer; and
a second wire provided in the insulating layer,
wherein the first capacitance element includes a dielectric layer,
the first terminal includes at least a portion of the first wire,
the second terminal includes at least a portion of the second wire, and
the dielectric layer includes a portion of the insulating layer in which the first wire and the second wire are embedded.

8. The imaging device according to claim 1, further comprising:
an insulating layer,
wherein the first capacitance element is provided in the insulating layer,
the first capacitance element includes a dielectric layer,
the first terminal is a first electrode,
the second terminal is a second electrode, and
the dielectric layer and the insulating layer differ from each other in composition.

9. The imaging device according to claim 1, further comprising:
a voltage fluctuation wire; and
a first shield, wherein:
a voltage of the voltage fluctuation wire varies, and
the voltage fluctuation wire and the first shield are located in the first pixel; and
a distance between the voltage fluctuation wire and the first shield is smaller than a distance between the voltage fluctuation wire and the first capacitance element.

10. The imaging device according to claim 9,
wherein the voltage of the voltage fluctuation wire varies in a state in which a voltage of the first shield is fixed.

11. The imaging device according to claim 9, further comprising:
a semiconductor substrate,
wherein, in a first section that is orthogonal to a thickness direction of the semiconductor substrate, the first shield is provided between the voltage fluctuation wire and the first capacitance element.

12. The imaging device according to claim 9, further comprising:
a semiconductor substrate,
wherein, in a second section that is parallel to a thickness direction of the semiconductor substrate, the first shield is provided between the voltage fluctuation wire and the first capacitance element.

13. The imaging device according to claim 9,
wherein a line segment that connects the voltage fluctuation wire and the first capacitance element passes through the first shield.

14. The imaging device according to claim 1,
wherein the first pixel has a first diffusion region electrically connected to the photoelectric converting portion and the first terminal.

15. The imaging device according to claim 14,
wherein the first pixel has
a third transistor including a third source and a third drain, and
a fourth transistor including a fourth gate;
the first diffusion region is one of third source and the third drain; and
the first diffusion region is electrically connected to the fourth gate.

16. The imaging device according to claim 14,
wherein the photoelectric converting portion includes a first electrode, a second electrode, and a photoelectric conversion layer arranged between the first electrode and the second electrode; and
the first electrode is electrically connected to the first diffusion region and the first terminal.

17. The imaging device according to claim 14,
wherein the photoelectric converting portion is a photodiode; and
the photodiode includes the first diffusion region.

18. The imaging device according to claim 14,
wherein the first pixel has a fifth transistor;
the photoelectric converting portion is a photodiode; and
the signal charge is transferred from the photodiode to the first diffusion region via the fifth transistor.

19. A camera system comprising:
an imaging device that comprises a first pixel including
a photoelectric converting portion that converts incident light into signal charge,
a first capacitance element including a first terminal and a second terminal, the first terminal being electrically connected to the photoelectric converting portion in an exposure period, and
a first transistor including a first source and a first drain, one of the first source and the first drain being electrically connected to the second terminal, and a direct-current potential being applied to the other of the first source and the first drain; and
a control circuit that turns on or off the first transistor in accordance with a photography mode,
wherein when the first transistor is turned on, the direct-current potential is applied to the second terminal and when the first transistor is turned off, the second terminal is electrically floating.

20. The imaging device according to claim 9, wherein the voltage fluctuation wire is at least one of a vertical signal line coupled to a column-signal processing circuit or a feedback line coupled to an inverting amplifier.

21. The imaging device according to claim 1, wherein the first terminal is electrically connected to the photoelectric converting portion not through a switching element.

* * * * *